(12) United States Patent
Khaderbad et al.

(10) Patent No.: US 12,136,570 B2
(45) Date of Patent: Nov. 5, 2024

(54) GRAPHENE LAYER FOR LOW RESISTANCE CONTACTS AND DAMASCENE INTERCONNECTS

(71) Applicant: Taiwan Semiconductor Manufacturing Co., Ltd., Hsinchu (TW)

(72) Inventors: Mrunal Abhijith Khaderbad, Hsinchu (TW); Wei-Yen Woon, Hsinchu (TW); Cheng-Ming Lin, Kaohsiung (TW); Han-Yu Lin, Nantou (TW); Szu-Hua Chen, Hsinchu (TW); Jhih-Rong Huang, Zhubei (TW); Tzer-Min Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 352 days.

(21) Appl. No.: 17/550,670

(22) Filed: Dec. 14, 2021

(65) Prior Publication Data
US 2022/0285221 A1 Sep. 8, 2022

Related U.S. Application Data

(60) Provisional application No. 63/157,517, filed on Mar. 5, 2021.

(51) Int. Cl.
*H01L 21/8234* (2006.01)
*H01L 21/48* (2006.01)
*H01L 21/768* (2006.01)
*H01L 29/417* (2006.01)
*H01L 29/66* (2006.01)
*H01L 29/78* (2006.01)

(52) U.S. Cl.
CPC .... *H01L 21/823431* (2013.01); *H01L 21/486* (2013.01); *H01L 21/76871* (2013.01); *H01L 29/41791* (2013.01); *H01L 29/66795* (2013.01); *H01L 29/785* (2013.01)

(58) Field of Classification Search
CPC .................. H01L 21/7687; H01L 21/4179
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

*Primary Examiner* — Mounir S Amer
(74) *Attorney, Agent, or Firm* — Sterne, Kessler, Goldstein & Fox P.L.L.C.

(57) ABSTRACT

The present disclosure provides low resistance contacts and damascene interconnects with one or more graphene layers in fin structures of FETs. An example semiconductor device can include a substrate with a fin structure that includes an epitaxial region. The semiconductor device can also include an etch stop layer on the epitaxial region, and an interlayer dielectric layer on the etch stop layer. The semiconductor device can further include a metal contact, above the epitaxial region, formed through the etch stop layer and the interlayer dielectric layer, and a graphene film at interfaces between the metal contact and each of the epitaxial region, the etch stop layer, and the interlayer dielectric layer.

20 Claims, 22 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2017/0358486 A1* | 12/2017 | Ham ................. H01L 23/53276 |
| 2018/0166333 A1* | 6/2018 | Yang ................. H01L 23/53233 |
| 2018/0350913 A1* | 12/2018 | Yang ................. H01L 21/76879 |
| 2020/0243383 A1* | 7/2020 | Huang ............... H01L 23/53252 |
| 2022/0285515 A1* | 9/2022 | Khaderbad ........... H01L 29/165 |

* cited by examiner

GRAPHENE LAYER FOR LOW RESISTANCE CONTACTS AND DAMASCENE INTERCONNECTS

CROSS-REFERENCE TO RELATED APPLICATIONS

This application claims benefit of U.S. Provisional Patent Application No. 63/157,517, titled "Method of Graphene Insertion for Low Resistance Contacts and Damascene Interconnects," filed on Mar. 5, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, gate-all-around FETs, and finFETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
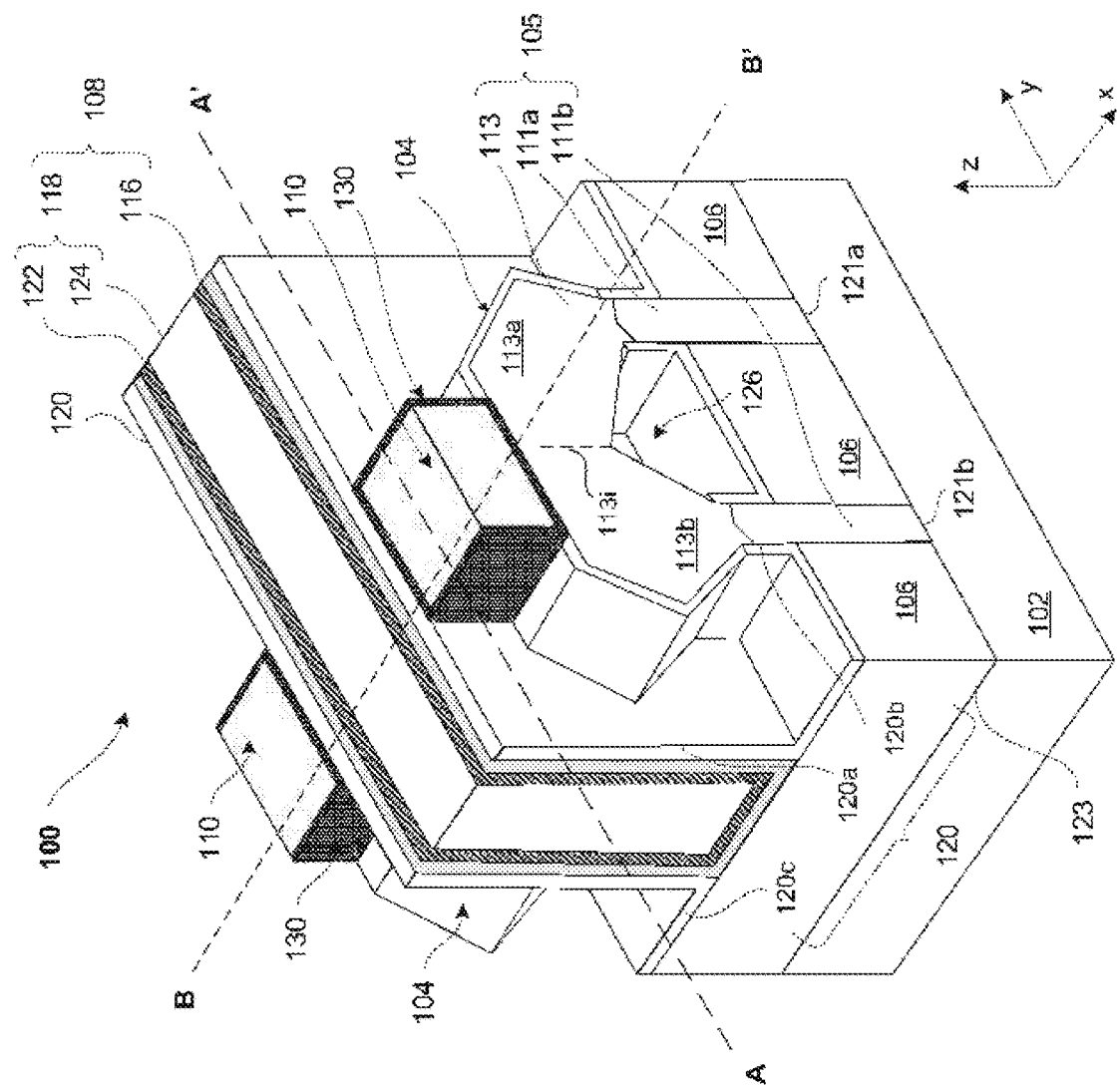
FIG. 1 is an isometric view of exemplary FETs, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As semiconductor devices shrink to smaller die size to reduce manufacturing cost and increase transistor density, low resistance in contacts and interconnects becomes a critical factor for device performance. Due to aggressive scaling of critical dimensions and using barrier layers, resistivity performance is impacted by contact resistivity between source/drain (S/D) epitaxial layer (EPI) to silicide, liner resistivity, and surface scattering effect. S/D contact resistivity, contact plug resistance, via, and interconnect resistance have become critical in advanced nodes (e.g., 5 nm process node size, 2 nm process node size, and other process node sizes).

Titanium silicide ($TiSi_x$) can be used in the formation of n-type FET (NFET) and p-type FET (PFET). Since the work function of $TiSi_x$ is close to Si mid-gap, the use of $TiSi_x$ can result in a higher contact resistance. To reduce the Schottky barrier height (SBH), dual silicides—instead of $TiSi_x$—can be used, but there is no manufacturing solution for a thermally stable n-type silicide on n-type epitaxial layer or p-type silicide on p-type epitaxial layer. Further, nitride materials (e.g., titanium nitride (TiN) and tantalum nitride (TaN)) can be used as liners and barriers of the metal vias/interconnects to suppress metal diffusion to the dielectric, which further increases the parasitic resistance and/or interconnect resistance with scaling.

This disclosure provides exemplary epitaxial low resistance contacts and damascene interconnects with one or more graphene (Gr) layers in fin structures of FETs (e.g., finFETs and/or gate-all-around FETs). This disclosure also provides exemplary methods for inserting Gr layers in interconnects, S/D contacts, and metal vias in middle-end-of-line (MEOL), and in back-end-of-line (BEOL) to achieve lower contact resistance and a thinner liner and barrier. For example, a Gr layer can be inserted between an interconnect metal and S/D EPI to lower SBH and reduce surface scattering by metal encapsulation in the Gr layer. As another example, a Gr layer can be inserted between an interconnect metal and interlayer dielectric (ILD) or low-k dielectric to act as a barrier and/or a liner with a reduced thickness. This disclosure further provides exemplary low temperature catalyst process for Gr growth on dielectrics and EPI.

FIG. 1 is an isometric view of an exemplary FET 100 in an integrated circuit after a gate replacement process. In some embodiments, FET 100 can be a finFET (shown in FIGS. 2-3) or a gate-all-around FET (GAA FET; shown in FIG. 4). FIG. 1 is for illustrative purposes and is not drawn to scale. FET 100 includes a fin structure 104 formed on a substrate 102, shallow trench isolation (STI) regions 106, a gate structure 108 disposed on fin structure 104, S/D contacts 110, and spacer 120. FIG. 1 is taken after formation of gate structure 108 in a gate replacement process. FIG. 1 shows one gate structure 108. However, there may be additional gate structure(s) (not shown) similar and parallel to gate structure 108. In addition, FET 100 may be incorporated into the integrated circuit through the use of other structural components, such as gate contacts, vias, interconnect metal layers, dielectric layers, and passivation layers, that are omitted for the sake of clarity.

Substrate 102 is a physical material on which FET 100 are formed. Substrate 102 includes a semiconductor material, such as, but not limited to, silicon, germanium, a compound semiconductor including silicon carbide, gallium arsenide, gallium phosphide, indium phosphide, indium arsenide, indium antimonide, an alloy including silicon germanium carbide, silicon germanium, gallium arsenic phosphide, gallium indium phosphide, gallium indium arsenide, gallium indium arsenic phosphide, aluminum indium arsenide, aluminum gallium arsenide, and a combination thereof. In some embodiments, substrate 102 includes a crystalline silicon substrate (e.g., a silicon wafer). In some embodiments, substrate 102 includes an epitaxial layer (EPI), and/or includes a silicon-on-insulator (SOI) structure. Further, substrate 102 may be doped with p-type dopants, such as boron, indium, aluminum, and gallium, or n-type dopants, such as phosphorus (P) and arsenic (As). The doped substrate 102 may be used for an n-type FET, or alternatively used for a p-type FET.

STI regions 106 provide electrical isolation of fin structure 104 from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure.

Gate structure 108 traverses fin structure 104. Fin structure 104 underlying gate structure 108 define the channel regions of FET 100. Gate structure 108 includes a gate electrode 118 and a gate insulating structure 116 adjacent to and in contact with gate electrode 118. Gate structure 108 may further include capping layers, etch stop layers, and/or other suitable materials.

Gate insulating structure 116 traverses fin structure 104. In some embodiments, gate insulating structure 116 includes one or more layers of silicon oxide, silicon nitride, silicon oxynitride, or high-k dielectric materials, such as hafnium oxide ($HfO_2$), $TiO_2$, HfZrO, $Ta_2O_3$, $HfSiO_4$, $ZrO_2$, $ZrSiO_2$, and a combination thereof. As used herein, the term "high-k" refers to a high dielectric constant. In the field of semiconductor device structures and manufacturing processes, high-k refers to a dielectric constant that is greater than the dielectric constant of Sift (e.g., greater than 3.9). Alternatively, high-k dielectric materials may include metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. In some embodiments, gate insulating structure 116 includes a single layer or a stack of insulating material layers. Gate insulating structure 116 may be formed by chemical vapor deposition (CVD), atomic layer deposition (ALD), physical vapor deposition (PVD), e-beam evaporation, or other suitable process. Spacer 120 includes an insulating material, such as silicon oxide and silicon nitride, and protects the underlying regions during subsequent processing of the FETs. Spacer 120 includes spacer portions 120a that form sidewalls of gate structure 108, spacer portions 120b that form sidewalls of fin structure 104, and spacer portions 120c that form protective layers on STI regions 106.

Gate electrode 118 may include a gate work function metal layer 122 and a gate metal fill layer 124. In some embodiments, gate work function metal layer 122 is disposed on gate insulating structure 116. Gate work function metal layer 122 may include a single metal layer or a stack of metal layers. The stack of metal layers may include metals having work functions similar to or different from each other. In some embodiments, gate work function metal layer 122 includes any suitable material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Exemplary work function metal (s) that may be included in gate work function metal layer 122 in a p-type device include TiN, TaN, Ru, Mo, Al, WN, $ZrSi_2$, $MoSi_2$, $TaSi_2$, $NiSi_2$, WN, other suitable p-type work function metals, or combinations thereof. Exemplary work function metal(s) that may be included in work function metal layer 122 in an n-type device include Ti, Ag, TaAl, TaAlC, TiAlN, TaC, TaCN, TaSiN, Mn, Zr, other suitable n-type work function materials, or combinations thereof. Gate work function metal layer 122 may be formed using a suitable process, such as ALD, CVD, PVD, plating, and combinations thereof.

Gate metal fill layer 124 may include a single metal layer or a stack of metal layers. The stack of metal layers may include metals different from each other. In some embodiments, gate metal fill layer 124 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 may be formed by ALD, PVD, CVD, or other suitable conductive material deposition process.

Fin structure 104 includes epitaxial regions (EPI) 105 disposed on both opposing sides of gate structure 108. Fin regions of fin structure 104 underlying gate structure 108 are regions formed from patterned portions of substrate 102 as described in detail below. EPIs 105 may form interfaces 121a and 121b with substrate 102 and interfaces (not shown) with regions of fin structure 104 underlying gate structure 108. In some embodiments, interfaces 121a and 121b are coplanar with interfaces 123 formed between STI regions 106 and substrate 102. In some embodiments, interfaces 121a and 121b are either above or below the level of interfaces 123.

EPIs 105 are configured to function as S/D regions of FET 100 and include epitaxially-grown semiconductor material. In some embodiments, the epitaxially-grown semiconductor material is the same material as the material of substrate 102. In some embodiments, the epitaxially-grown semiconductor material includes a different material from the material of substrate 102 and imparts a strain on the channel regions underlying gate structure 108. The epitaxially-grown semiconductor material may include semiconductor material, such as germanium and silicon; compound semiconductor materials, such as gallium arsenide, and aluminum gallium arsenide; or a semiconductor alloy, such as silicon germanium and gallium arsenide phosphide.

In some embodiments, EPIs 105 are grown by CVD, e.g., low pressure chemical vapor deposition (LPCVD), atomic layer chemical vapor deposition (ALCVD), ultra-high vacuum chemical vapor deposition (UHVCVD), remote plasma chemical vapor deposition (RPCVD); molecular beam epitaxy (MBE) processes; any suitable epitaxial process; or any combinations thereof. In some embodiments, EPIs 105 are grown by an epitaxial deposition/partial etch process, which repeats the epitaxial deposition/partial etch process at least once. Such repeated deposition/partial etch process is also called a cyclic deposition-etch (CDE) process. In some embodiments, EPIs 105 are grown by selective epitaxial growth (SEG), where an etching gas is added to promote the selective growth of semiconductor material on the exposed surfaces of substrate 102, but not on insulating material (e.g., dielectric material of STI regions 106).

Further, EPIs 105 may be in-situ doped during the epitaxial growth process or by an ion implantation process after the epitaxial growth process. In some embodiments, EPIs 105 may be doped with p-type dopants, such as boron, indium, and gallium; n-type dopants, such as phosphorus and arsenic; and/or combinations thereof. SiGe EPIs 105 may be doped with p-type or n-type dopants, and/or combinations thereof. Si EPIs 105 may be doped with carbon and/or phosphorous. For p-type in-situ doping, p-type doping precursors, such as, but not limited to, diborane ($B_2H_6$) and boron trifluoride ($BF_3$), can be used. For n-type in-situ doping, n-type doping precursors, such as, but not limited to, $PH_3$ and $AsH_3$, can be used.

Each of EPIs 105 may include sub-regions 111a, 111b, 113a and 113b. Sub-regions 111a and 111b are epitaxially grown on different portions of substrate 102 and form respective interfaces 121a and 121b with substrate 102. As shown in FIG. 1, merged sub-region 113 may include portions 113a and 113b, which are epitaxially grown from respective unmerged sub-regions 111a and 111b and are merged at interface 113i. Fin structure 104 may be referred to as "a merged fin structure" because of its merged epitaxial portions 113a and 113b. In some embodiments, a top surface of EPIs 105 may be a (100) crystal plane of sub-regions 113.

Sub-regions 111a, 111b, 113a and 113b may be epitaxially grown under a pressure of about 10 Torr to about 300 Torr, at a temperature of about 500° C. to about 700° C. using reaction gases, such as hydrogen chloride (HCl) as an etching agent, germane ($GeH_4$) as a germanium (Ge) precursor, dichlorosilane ($SiH_2Cl_2$ or DCS) and/or silane ($SiH_4$) as a silicon (Si) precursor, $B_2H_6$ as boron (B) dopant precursor, hydrogen ($H_2$), and/or nitrogen ($N_2$). To achieve different concentrations of Ge in sub-regions 111a, 111b, 113a and 113b, the ratio of flow rate of Ge to Si precursors may be varied during their respective growth process.

Sub-regions 111a, 111b, 113a and 113b may have varying dopant concentration with respect to each other. For example, sub-regions 111a and 111b may be undoped or each may have a dopant concentration lower than the dopant concentrations of sub-regions 113a and 113b. In some embodiments, sub-regions 111a and 111b each have a dopant concentration less about $5\times10^{20}$ atoms/$cm^3$, while sub-regions 113a and 113b have a dopant concentration in a range from about $1\times10^{20}$ atoms/$cm^3$ to about $3\times10^{21}$ atoms/$cm^3$. In some embodiments, sub-regions 113a and 113b may have a gradient dopant concentration.

Also shown in FIG. 1, an insulating material (e.g., air) including void 126 is included within FET 100. Void 126 may bound by portions of sub-regions 111a, 111b, 113a and 113b, STI region 106, and spacer 120. The cross-sectional profile of void 126 is not limited to the pentagon shape shown in FIG. 1, but may have any suitable geometric shape (e.g., circular, triangular, rectangular).

As shown in FIG. 1, S/D contacts 110 can be formed on the EPIs 105 and between S/D regions of FET 100 and metal layers (not shown). Each S/D contact 110 can include a single metal layer or a stack of metal layers. The stack of metal layers may include metals different from each other. In some embodiments, S/D contact 110 includes any suitable conductive material, such as Co, W, Ru, Ti, Ag, Al, TiAlN, TaC, TaCN, TaSiN, Mn, Zr, TiN, TaN, Mo, WN, Cu, Ni, TiC, TiAlC, TaAlC, metal alloys, and combinations thereof. S/D contacts 110 may be formed by ALD, PVD, CVD, or other suitable conductive material deposition process.

A graphene (Gr) film 130 (also referred to as "carbon layer"), comprising one or more layers of carbon atoms, can be formed on a bottom surface and sidewalls of S/D contacts 110. By using Gr interface between S/D contacts (e.g., S/D contacts 110) and S/D regions (e.g., EPI 113) of FET 100, the S/D contact resistivity can be reduced by SBH tuning. Further, the Gr film 130 can act as a diffusion barrier to suppress metal diffusion from S/D contacts 110 to surrounding dielectric, and act as a high conductivity liner due to the superconductivity property of graphene to reduce surface elastic scattering to further reduce S/D contact resistance. In some embodiments, a bottom surface of Gr film 130 can be located within the S/D regions (e.g., EPI 113). A thickness of Gr film 130 can be in a range from about 0.3 nm to about 5 nm. If the thickness of Gr film 130 is below 0.3 nm, Gr film 130 may not adequately reduce contact resistance between S/D contacts (e.g., S/D contacts 110) and S/D regions (e.g., EPI 113) of FET 100. On the other hand, if the thickness of Gr film 130 is above 5 nm, the device size increases, and consequently, increases device manufacturing cost. In some embodiments, the number of layers of carbon atoms of Gr film 130 can be determined based on structure stability of the interface between the Gr film 130 and S/D contacts or metal plugs. For example, if the material of a metal plug is Cu, a monolayer graphene can be used as the liner. As another example, if the material of a S/D contact is Ni or Ru, a multi-layer (e.g., bilayer, triple-layer, or four-layer) graphene can be used as the linear.

Figure 2:
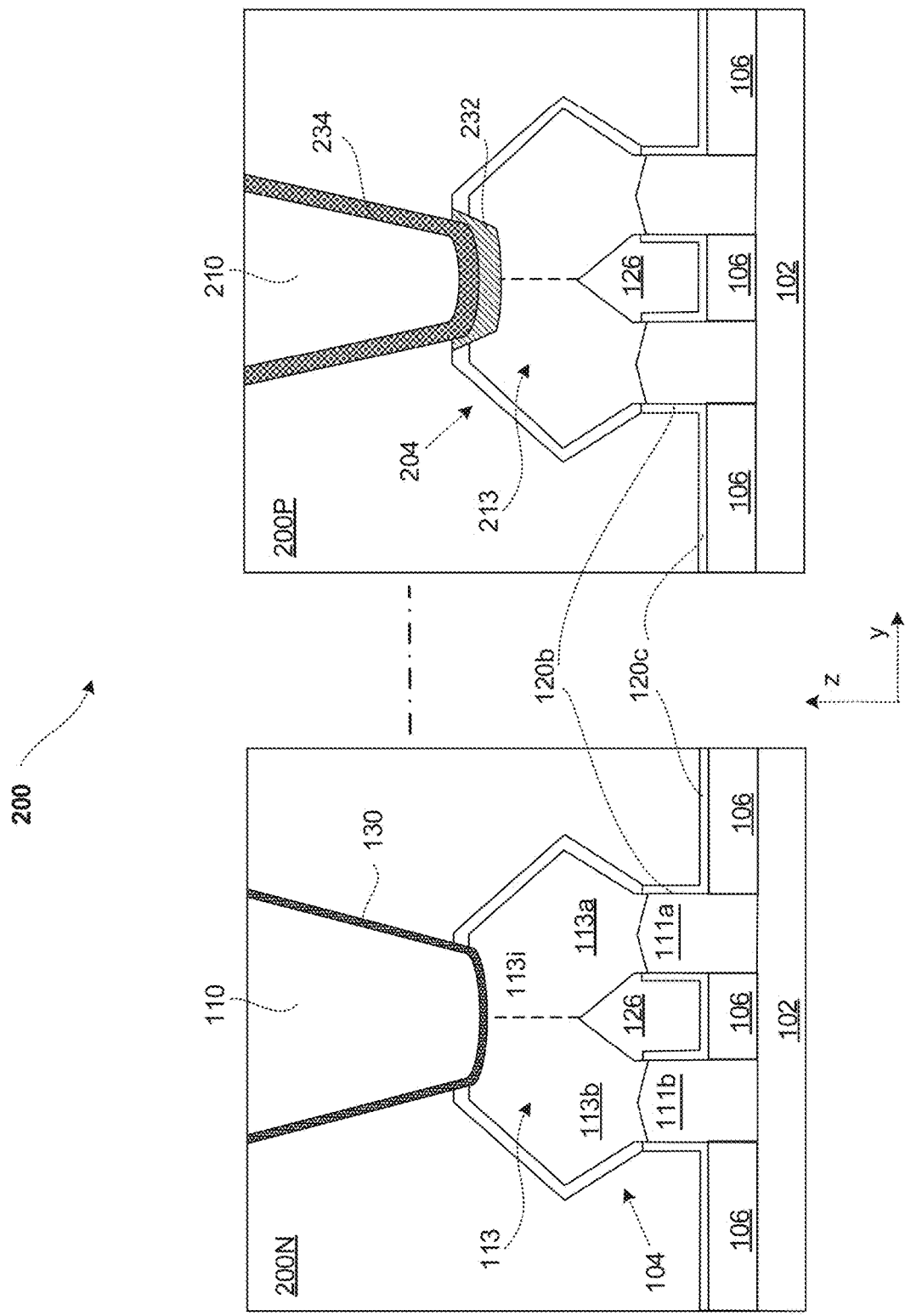
FIG. 2 is a cross-sectional view of exemplary FETs, in accordance with some embodiments of the present disclosure.
Figure 3:
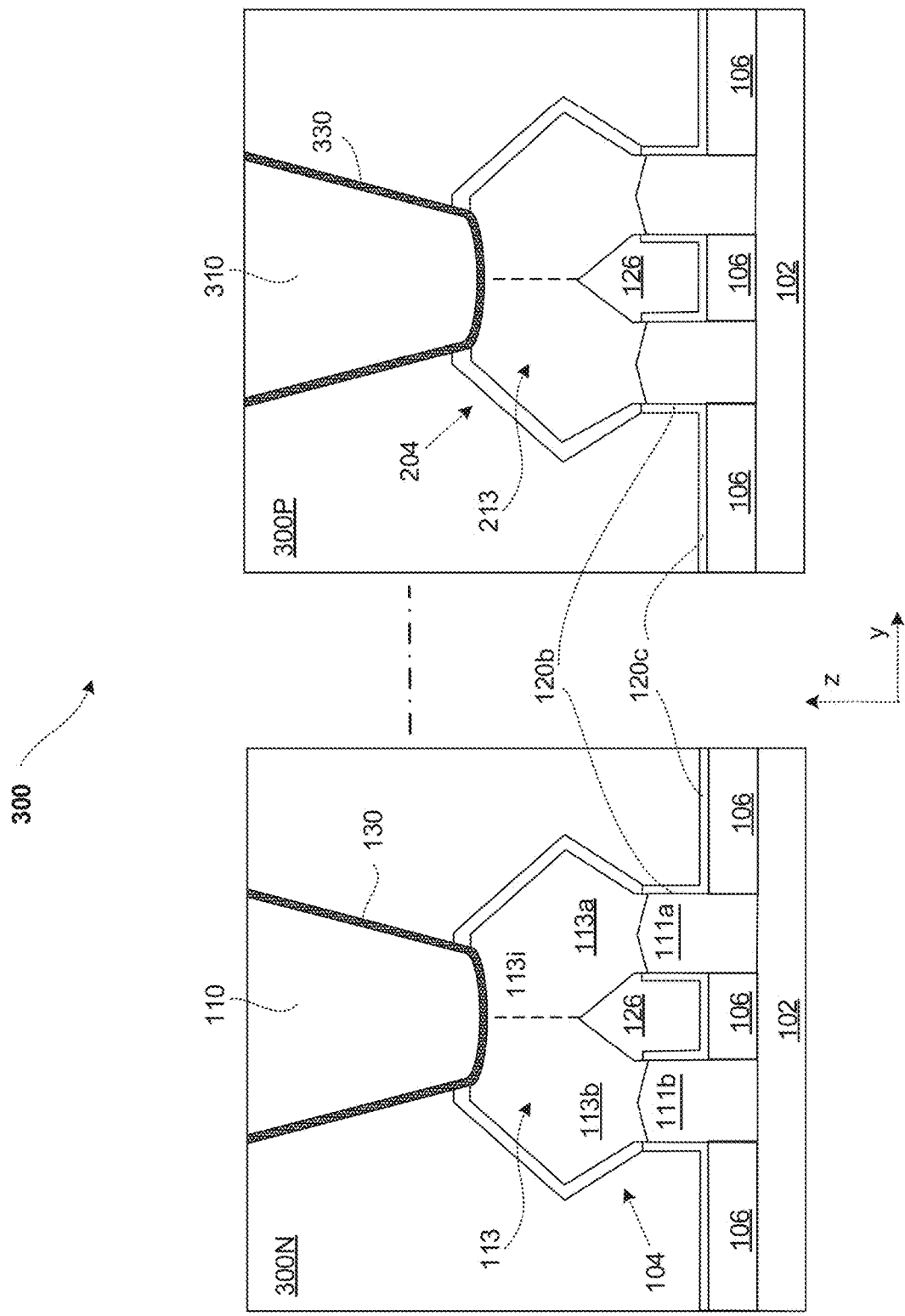
FIG. 3 is a cross-sectional view of exemplary FETs, in accordance with some embodiments of the present disclosure.

Graphene (Gr) film 130 can be used in either NFET or PFET or both NFET and PFET, according to some embodiments. FIGS. 2 and 3 illustrate two exemplary finFETs, in accordance with some embodiments of the present disclosure. Referring to FIG. 2, an NFET 200N and a PFET 200P are illustrated in a cross-sectional view along a line A-A' as shown in FIG. 1. The NFET 200N is the same as the isometric view of FET as shown in FIG. 1, in which EPI 113 can be a Si EPI doped with n-type type dopants (e.g., phosphorus and arsenic) and a Gr film 130 is formed on a bottom surface and sidewalls of S/D contact 110. PFET 200P includes EPI 213, which can be a SiGe EPI doped with p-type type dopants (e.g., boron, indium, and gallium). PFET 200P can further include a barrier 232 including p-type metal silicide (e.g., $TiSi_x$) formed in a recess of EPI 213, and a liner 234 (e.g., TiN and TaN) formed on a bottom surface and sidewalls of S/D contact 210. In some embodiments, Gr film 130 may also be formed in PFET, while NFET uses silicide as the barrier and uses metal nitride as the liner. Referring to FIG. 3, both NFET 300N and PFET 300P include a Gr film 130/330 as a liner and/or a barrier.

Figure 4:
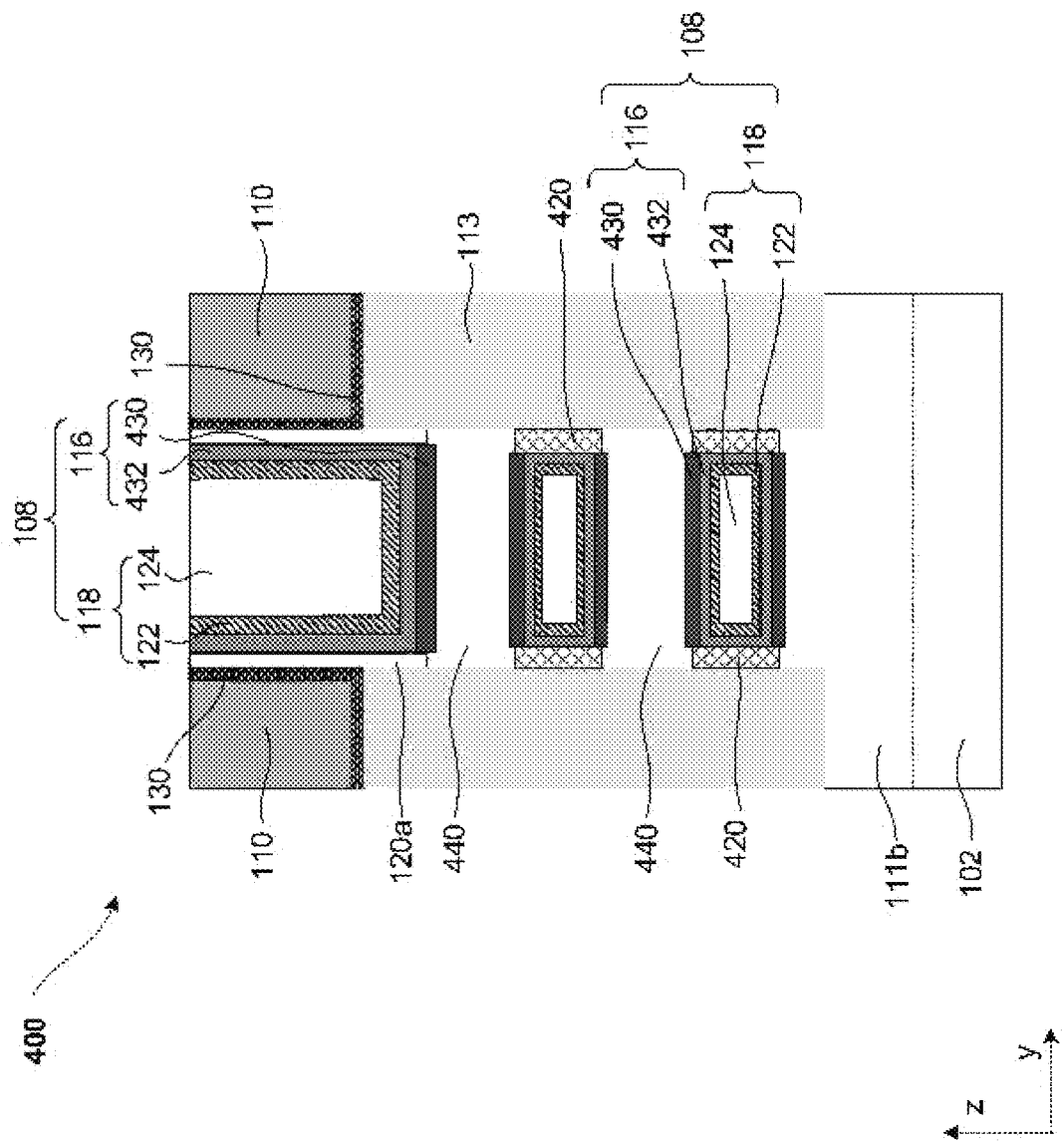
FIG. 4 is a cross-sectional view of an exemplary GAA FET, in accordance with some embodiments of the present disclosure.

It is also noted that, the graphene (Gr) film 130 can be used in gate-all-around FETs (GAA-FETs). FIG. 4 is a cross-sectional view of exemplary GAA-FET 400 along BB' direction as shown in FIG. 1, in accordance with some embodiments of the present disclosure. As shown in FIG. 4, GAA-FET 400 can include (i) stacks of nanostructured channel regions 440 disposed on fin structure 111b, (ii) gate structures 108 disposed on and wrapped around nanostructured channel regions 440, (iii) epitaxial S/D regions 113, (iv) inner spacers 420, (v) graphene film 130, and (vi) S/D contact 110. As used herein, the term "nanostructured" defines a structure, layer, and/or region as having a horizontal dimension (e.g., along an x- and/or y-axis) and/or a vertical dimension (e.g., along a z-axis) less than about 100 nm, for example about 90 nm, about 50 nm, about 10 nm, or other values less than about 100 nm are within the scope of the disclosure.

Nanostructured channel regions 440 can include semiconductor materials similar to or different from substrate 102 and can include semiconductor material similar to or different from each other. In some embodiments, nanostructured channel regions 440 can include Si, silicon arsenic (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials.

Though two nanostructured channel regions 440 are shown in each stack, GAA-FET 400 can include any number of nanostructured channel regions 440 in each stack. Though rectangular cross-sections of nanostructured channel regions 440 are shown, nanostructured channel regions 440 can have cross-sections of other geometric shapes (e.g., circular, elliptical, triangular, or polygonal).

For n-type GAA-FET 400, S/D regions 113 can include an epitaxially-grown semiconductor material, such as Si, and n-type dopants, such as phosphorus and other suitable n-type dopants. For p-type GAA-FET 400, S/D regions 113 can include an epitaxially-grown semiconductor material, such as Si and SiGe, and p-type dopants, such as boron and other suitable p-type dopants.

Gate structures 108 can be multi-layered structures and can surround nanostructured channel regions 440, for which gate structures 108 can be referred to as "gate-all-around (GAA) structures" or "horizontal gate-all-around (HGAA) structures." Gate structures 108 surrounding nanostructured channel regions 440 can be electrically isolated from adjacent S/D regions 113 by inner spacers 420. Gate structure 108 disposed on the stacks of nanostructured channel regions 440 can be electrically isolated from adjacent S/D regions 113 by spacers portions 120a. Inner spacers 420 and spacer portions 120a can include an insulating material, such as Sift, SiN, SiCN, SiOCN, and other suitable insulating materials.

In some embodiments, gate lengths of gate structures 108 are substantially equal to each to other. Gate structures 108 can include (i) gate insulating structures 116, (ii) gate work function metal (WFM) layers 122 disposed on gate insulating structures 116, and (iii) gate metal fill layers 124 disposed on WFM layers 122. In some embodiments, gate structure 108 can further include glue layers (not shown) between WFM layers 122 and gate metal fill layers 124 for better adhesion of gate metal fill layers 124 to WFM layers 122. The glue layers can include titanium nitride (TiN), tantalum nitride (TaN), molybdenum nitride (MoN), tungsten nitride (WN), or other suitable metal nitrides. Though FIG. 4 shows that all the layers of gate structures 108 are wrapped around nanostructured channel regions 440, nanostructured channel regions 440 can be wrapped around by at least gate insulating structures 116. Accordingly, nanostructured channel regions 440 can be electrically isolated from each other to prevent shorting between gate structures 108 and S/D regions 113 during operation of GAA-FET 400.

In some embodiments, each gate insulating structure 116 can include interfacial oxide (IO) layer 430 and high-k (HK) gate dielectric layer 432. IO layer 430 can be formed by oxidizing the surfaces of nanostructured channel regions 440, and can include an oxide of the semiconductor material in nanostructured channel regions 440. HK gate dielectric layer 432 can include (i) a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a HK dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable HK dielectric materials. As used herein, the term "high-k (HK)" refers to a high dielectric constant. In the field of semiconductor device structures and manufacturing processes, HK refers to a dielectric constant that is greater than the dielectric constant of $SiO_2$ (e.g., greater than 3.9).

For n-type GAA-FET 400, WFM layers 122 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For p-type GAA-FET 400, WFM layers 122 can include substantially Al-free (e.g., with no Al) conductive materials, such as titanium nitride (TiN), titanium carbon nitride (TiCN), titanium silicon nitride (TiSiN), titanium gold (Ti—Au) alloy, titanium copper (Ti—Cu) alloy, tantalum nitride (TaN), tantalum carbon nitride (TaCN), tantalum silicon nitride (TaSiN), tantalum gold (Ta—Au) alloy, tantalum copper (Ta—Cu), tungsten nitride (WN), tungsten carbon nitride (WCN), other suitable substantially Al-free conductive materials, and a combination thereof.

In some embodiments, gate metal fill layers 124 can include conductive materials with low resistivity (e.g., resistivity about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), copper (Cu), molybdenum (Mo), other suitable conductive materials with low resistivity, and a combination thereof.

As shown in FIG. 4, Gr film 130 can be formed on a top surface of S/D regions 113 and on a sidewall of spacers portions 120a. S/D contact 110 can be formed on Gr film 130. It is noted that, Gr film 130 can be used in either p-type GAA-FET or n-type GAA-FET or both n-type GAA-FET and p-type GAA-FET, according to some embodiments. By using Gr film 130 between S/D contacts 110 and S/D regions 113 of GAA-FET 400, the S/D contact resistivity can be reduced by SBH tuning. Further, the Gr film 130 can act as a diffusion barrier to suppress metal diffusion from S/D contacts 110 to surrounding dielectric, and act as a high conductivity liner due to the superconductivity property of graphene to reduce surface elastic scattering to further reduce S/D contact resistance. A thickness of Gr film 130 can be a range from about 0.3 nm to about 5 nm. The thickness of Gr film 130 is much less than the thickness of ordinary Ta/TaN liner and/or barrier used in other devices, thus allows more volume for S/D contacts 110.

Figure 5:
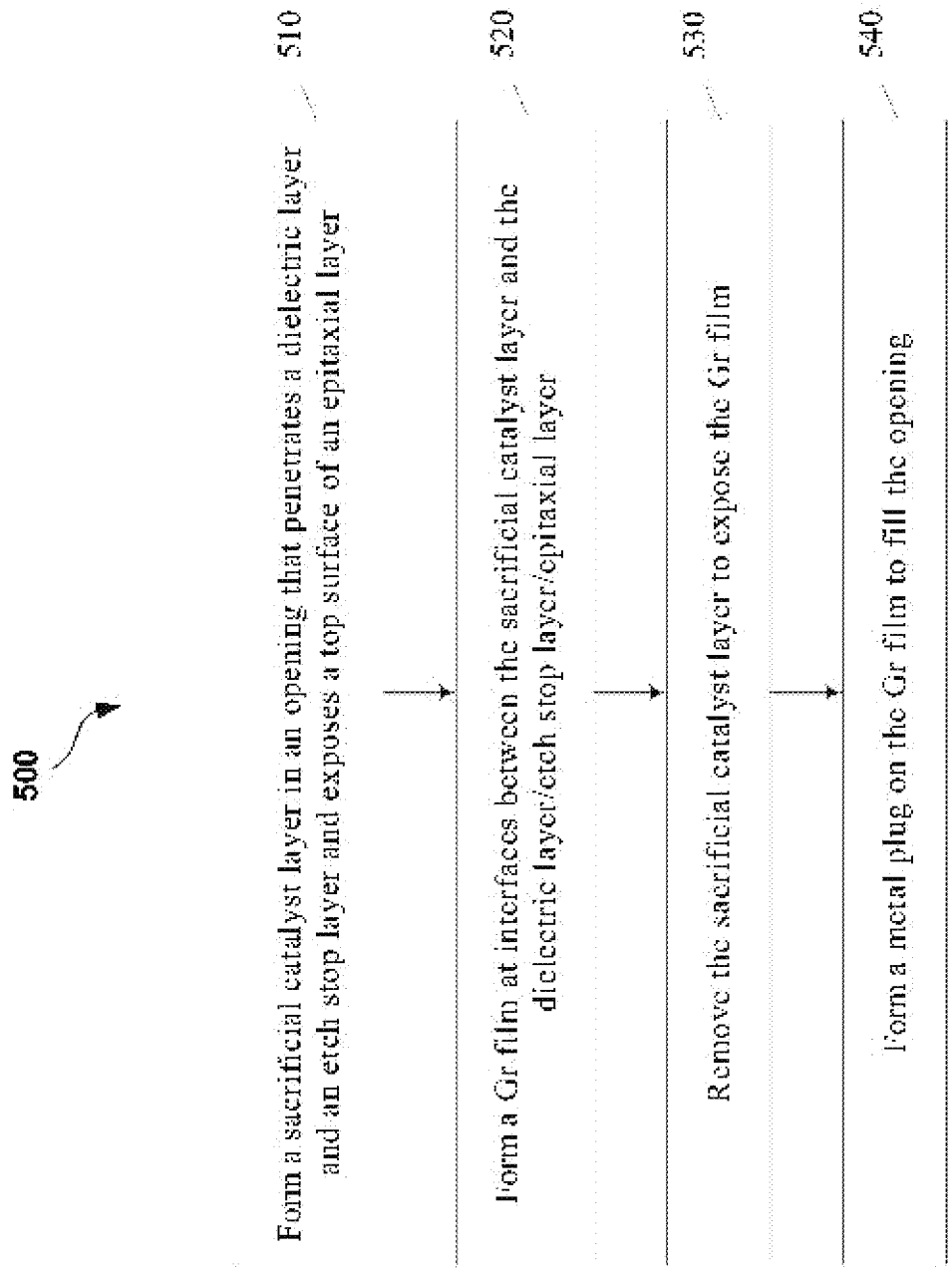
FIG. 5 is a flow diagram of an exemplary method for inserting a graphene film for a contact in a FET, in accordance with some embodiments of the present disclosure.

FIG. 5 is a flow diagram of an exemplary method 500 for inserting a Gr film for a contact in a FET, in accordance with some embodiments of the present disclosure. FIGS. 6A-6D illustrate schematic cross-sectional views of a portion of an exemplary FET at certain fabricating stages of the method shown in FIG. 5, according to some embodiments of the present disclosure. Method 500 does not produce completed FET 100. Accordingly, it is understood that the operations shown in FIG. 5 are not exhaustive and that other operations can be performed before, after, or between any of the illustrated operations, and that some other processes may only be briefly described herein.

In operation 510, a sacrificial catalyst layer can be deposited in an opening that penetrates a dielectric layer and an etch stop layer and exposes a top surface of an epitaxial layer. The sacrificial catalyst layer can be used as a catalyst for graphene growth in a subsequent process.

In some embodiments, before operation 510, an epitaxial layer (EPI) 610 (e.g., EPIs 113 as shown in FIG. 1) can be epitaxially grown on a semiconductor material (e.g., substrate 102 as shown in FIG. 1). EPI 610 can be a Si EPI or a SiGe EPI. In some embodiments, EPI 610 is grown by CVD, e.g., LPCVD, ALCVD, UHVCVD, RPCVD, or MBE processes, or any other suitable epitaxial process or deposition/partial etch process. Further, EPI 610 can be in-situ doped during the epitaxial growth process or by an ion implantation process after the epitaxial growth process. For example, EPI 610 may be doped with p-type dopants (e.g., boron, indium, and gallium) or n-type dopants (e.g., phosphorus and arsenic). EPI 610 can function as S/D regions of the FET.

In some embodiments, before operation 510, an etch stop layer (ESL) 620 can be formed on a top surface of EPI 610, and an ILD 630 can be formed on ESL 620. ESL 620 can prevent over-etching due to a non-uniform topography of the FET from damaging the S/D regions of the FET. ESL 620 can include a dielectric material that has a different etching rate than the material of EPI 610 and ILD 630, such as silicon nitride, silicon oxynitride, silicon carbide, and silicon carbonitride. ILD 630 may be formed of a dielectric material different from ESL 620, such as silica (SiO2), hafnium silicate (HfSiO4), zirconium silicate (ZrSiO4), phosphosilicate glass (PSG), boro-silicate glass (BSG), boron-doped phospho-silicate glass (BPSG), undoped silicate glass (USG), and any other suitable insulation materials. ILD 630 may be deposited by any suitable method, such as CVD, plasma-enhanced CVD (PECVD), and flowable CVD (FCVD).

In some embodiments, before operation 510, an opening 690 can be formed in ESL 620 and ILD 630 to expose a top surface of EPI 610. Opening 690 can be formed by any suitable patterning process. For example, a lithography process can be performed to pattern a mask for opening 690 and one or more subsequent wet or dry etching processes can be performed to etch a portion of ESL 620 and ILD 630 exposed by the patterned mask. A cleaning process, such as an ashing process and a strip process, can be performed after the etching to clean the sidewalls and bottom of opening 690.

Figure 6B:
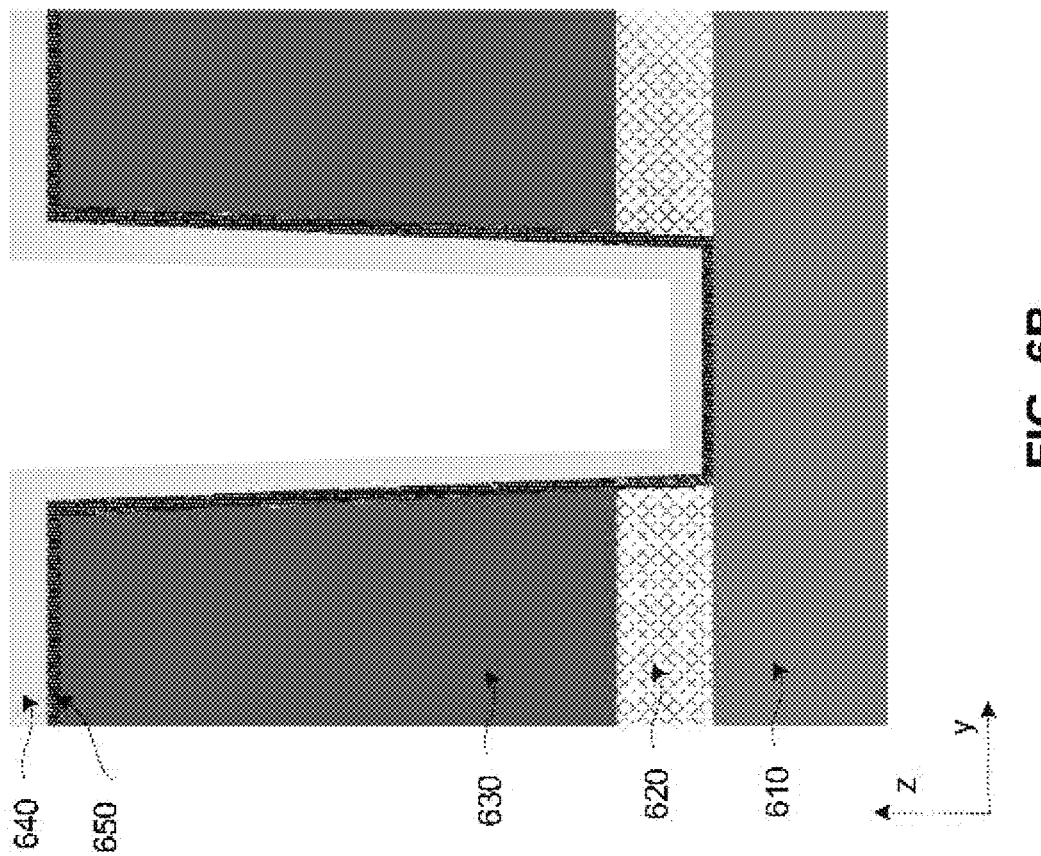
FIGS. 6A-6D are cross-sectional views of a portion of an exemplary FET at certain fabricating stages of the method shown in FIG. 5, in accordance with some embodiments of the present disclosure.
Figure 6A:
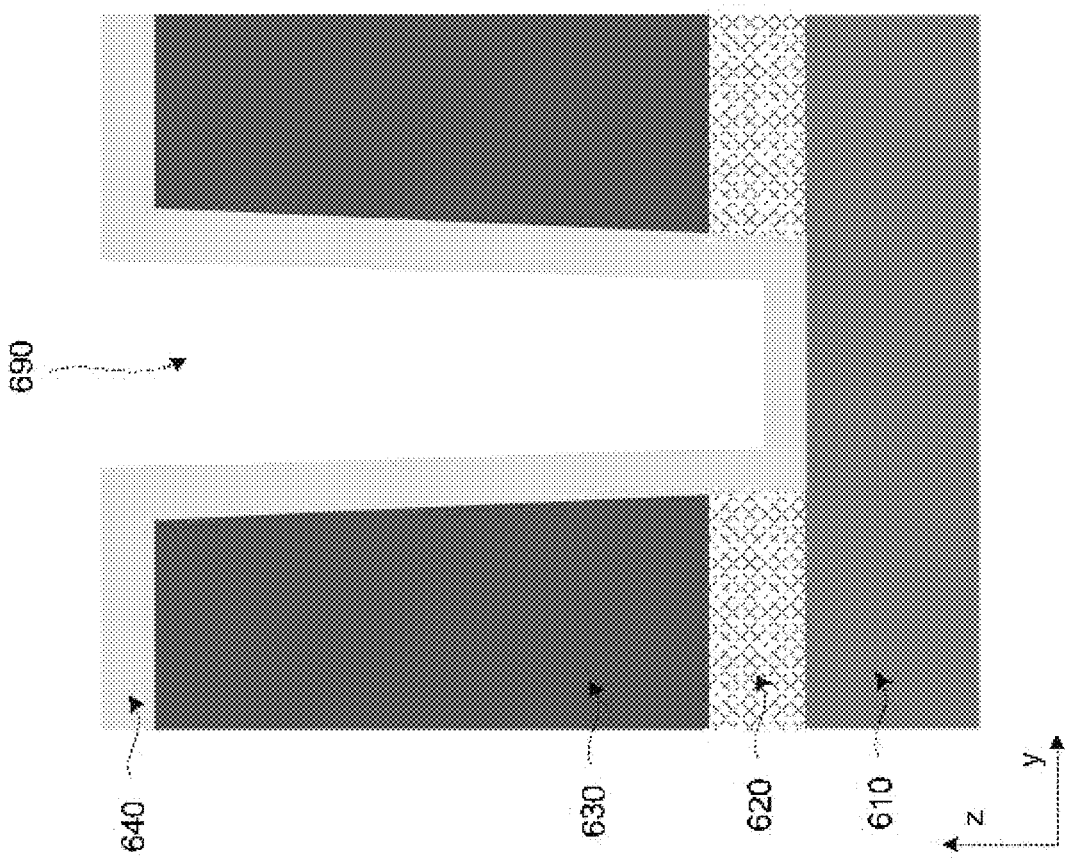

As shown in FIG. 6A, a sacrificial catalyst layer 640 can be formed to cover the bottom surface and sidewalls of opening 690. In some embodiments, growing graphene in integrated circuits can bypass the process of transferring the graphene, another destructive process, from a growth catalyst to the device. Sacrificial catalyst layer 640 can include a metal material that is different from the metal material used to form a metal plug in a subsequent process. For example, sacrificial catalyst layer 640 can include Ni or any other suitable metal material, and can be formed by any suitable CVD or ALD. In some embodiments, a thickness of sacrificial catalyst layer 640 can be in a range from about 2 nm to about 80 nm. For example, a pure Ni catalyst layer can be deposited to a thickness a range from about 2 nm to about 50 nm.

In operation 520, a Gr film can be formed at the interfaces between the sacrificial catalyst layer and the dielectric layer/etch stop layer/epitaxial layer. In some embodiments, the Gr film can be formed by performing an inductively coupled plasma chemical vapor deposition (ICP CVD) process or using a solid or liquid drive in process. In one example using ICP CVD, a chamber can be pumped to a base pressure in a range from about $1\times10^{-6}$ Torr to about $2\times10^{-6}$ Torr using $H_2$ at a process temperature in a range from about 400° C. to about 450° C. After using Ar to purge the chamber and reestablishing the base pressure, acetylene ($C_2H_2$) can be flown at a rate in a range from about 0.05 sccm to about 0.2 sccm bringing the chamber pressure to a value in a range from about $5\times10^{-6}$ Torr to about $7\times10^{-6}$ Torr. For plasma-enhanced growth, an activation anneal at an annealing temperature in a range from about 380° C. to about 450° C. (e.g., about 400° C.) can drive the deposited carbon atoms on the surface of the sacrificial catalyst layer 640 to be dissolved into the sacrificial catalyst layer 640, and to be precipitated and grown at the interfaces between the sacrificial catalyst layer 640 and EPI 610/ESL 620/ILD 630 to form Gr film 650, as shown in FIG. 6B. In some embodiments, a thickness of Gr film 650 can be in a range from about 0.8 nm to about 5 nm. Once the desired growth duration is reached (e.g., about 6 minutes to about 8 minutes for CVD growth, about 20 seconds to about 40 seconds for ICPCVD growth), $C_2H_2$ flow can be stopped, followed by another Ar purge to flush the remaining process gases out of the chamber. The chamber can then be cooled to room temperature.

In some embodiments, the layers of carbon atoms are formed less than or equal to about 10 layers to control the total thickness of Gr film 650 between about 0.3 nm and about 5 nm. Since the thickness of Gr film 130 is much less than the thickness of ordinary Ta/TaN liner and/or barrier used in other devices, thus allows more volume for S/D contacts 110. In some embodiments, the number of layers of carbon atoms of Gr film 650 can be determined based on structure stability of the interface between the Gr film 650 and S/D contacts or metal plugs. For example, if the material of a S/D contact is Ni or Ru, a multi-layer (e.g., bilayer, triple-layer, or four-layer) graphene can be used as the liner.

Figure 6D:
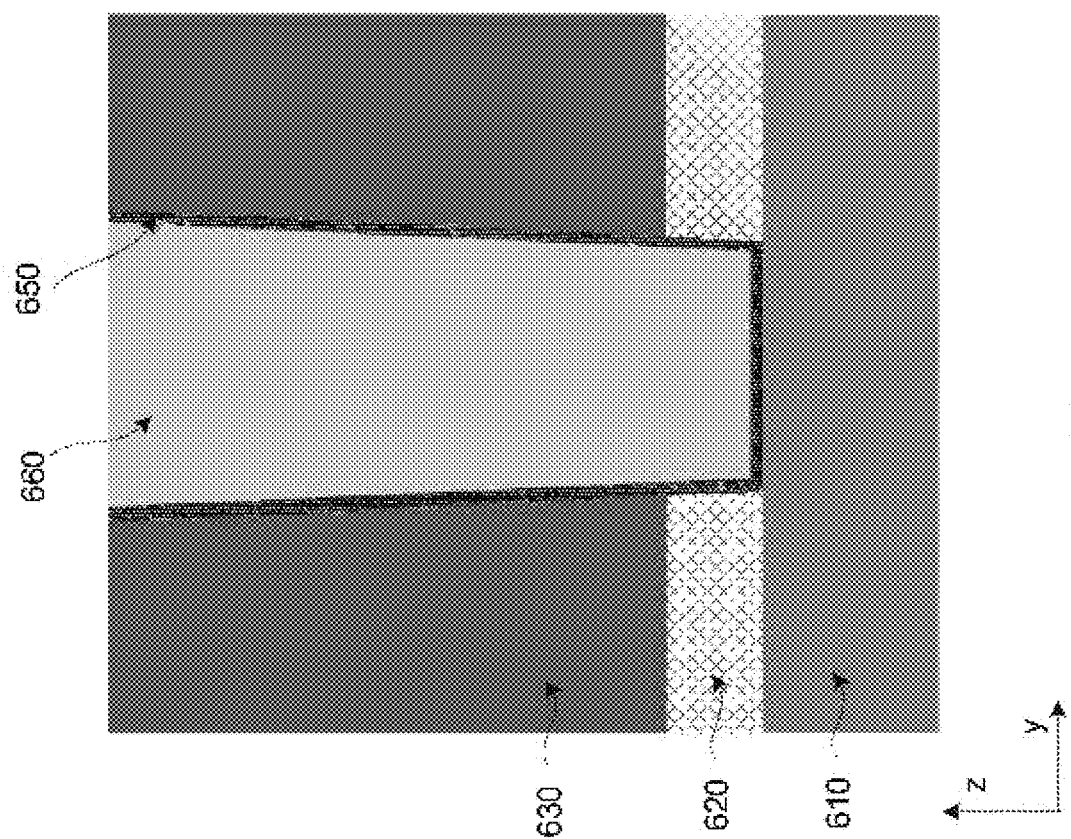
Figure 6C:
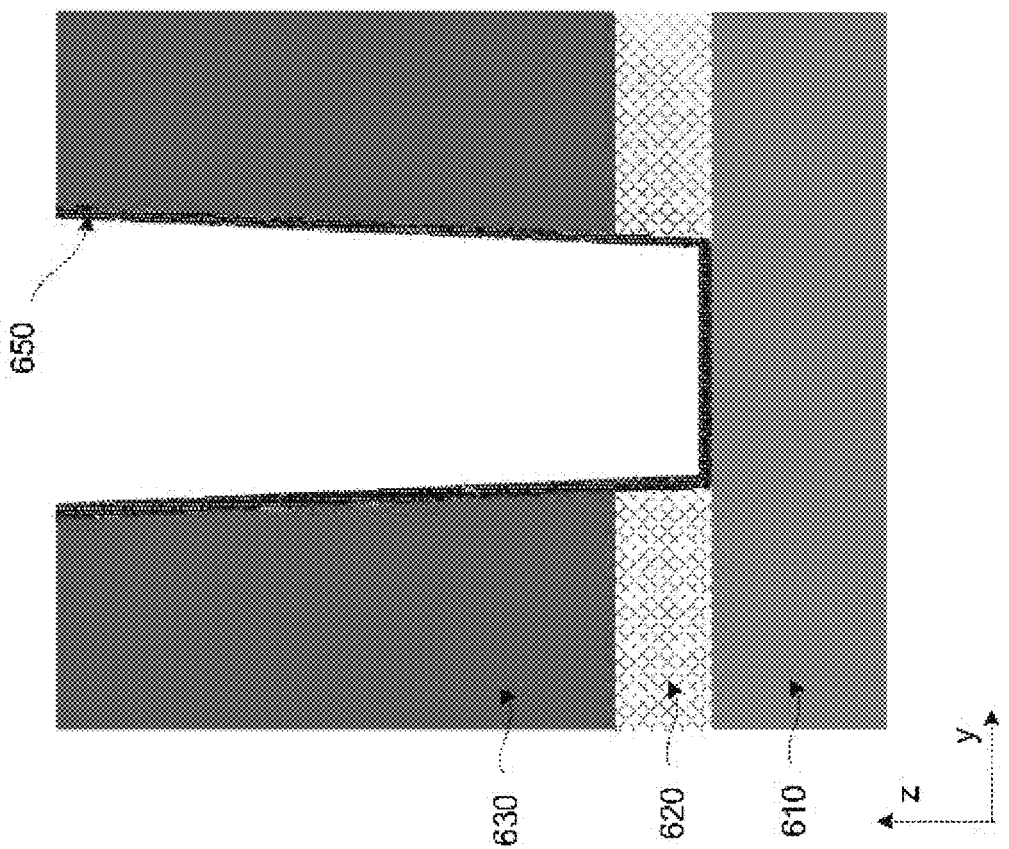

In operation 530, the sacrificial catalyst layer can be removed to expose the Gr film. In some embodiments, a wet etching process can be performed to remove the sacrificial catalyst layer 640. In one example, when the sacrificial catalyst layer 640 is a pure Ni layer, $FeCl_3$ solution can be used to etch the Ni layer. A subsequent grinding process or chemical mechanical polishing (CMP) process can be performed to remove a portion of Gr film 650 outside of opening 690. As a result, the remaining portion of Gr film 650 attached on the bottom surface and sidewalls of the opening 690 can be exposed, as shown in FIG. 6C.

In operation 540, a metal plug can be formed on the Gr film to fill the opening. In some embodiments, the metal plug 660 can include a metal material different from the sacrificial catalyst layer 640, such as Co, W, and Ru. Metal plug 660 can be formed by any suitable deposition process, such as a CVD process with a process temperature in a range from about 130° C. to about 400° C., a process pressure in a range from about 100 Pa to about 1000 Pa, and a fas flow rate in a range from about 10 sccm to about 500 sccm. A subsequent CMP process can be performed to etch back the deposited metal plug to substantially coplanarize top surfaces of ILD 630, Gr film 650, and metal plug 660, as shown in FIG. 6D.

Method 500 (corresponding to FIGS. 5 and 6A-6D) is directed to a method for inserting a Gr film for a S/D contact as an example. Method 500 can be extendible to insert a Gr film for any suitable vias, such as those in a metal layer BEOL fill process.

Figure 7:
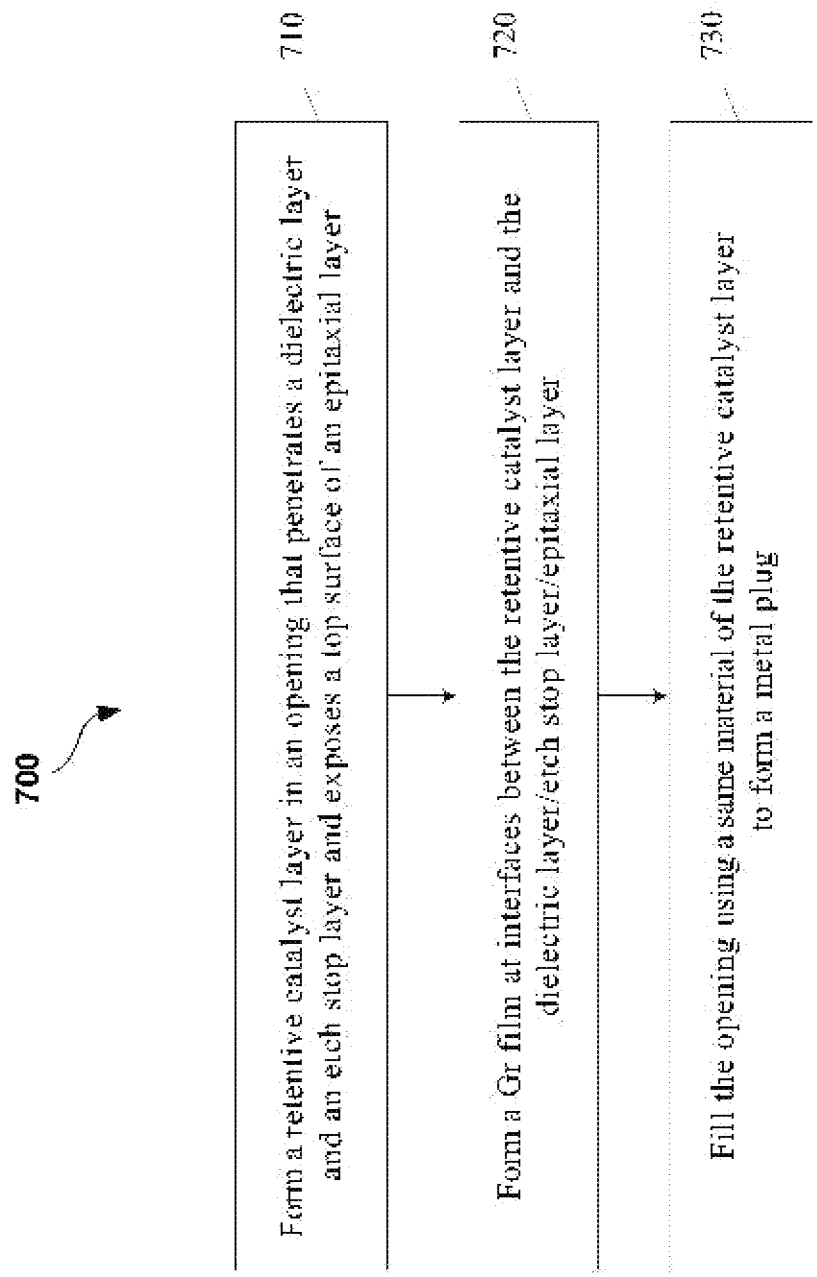
FIG. 7 is a flow diagram of an exemplary method for inserting a graphene film for a contact in a FET, in accordance with some embodiments of the present disclosure.
Figure 8:
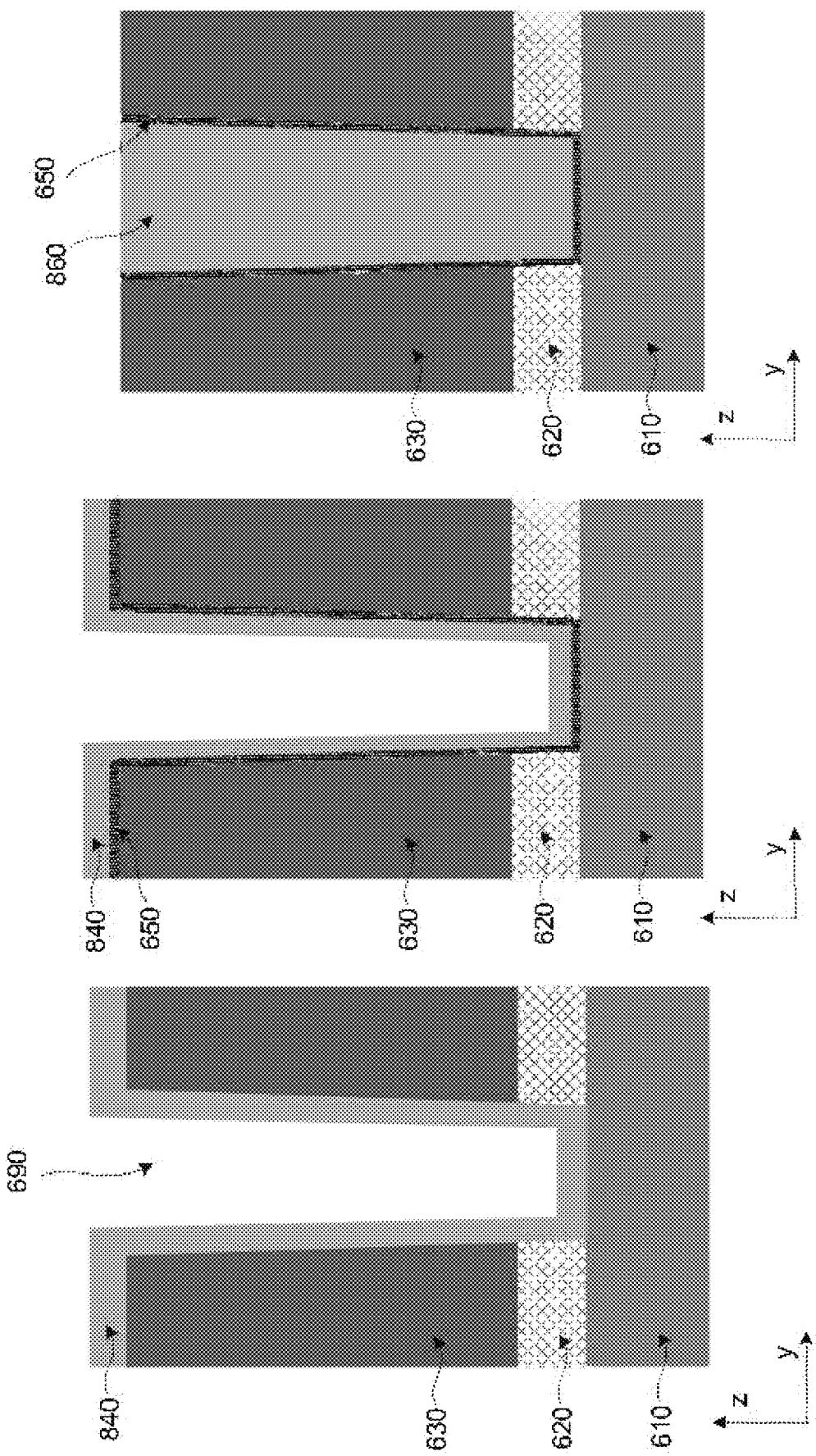
FIGS. 8A-8C are cross-sectional views of a portion of an exemplary FET at certain fabricating stages of the method shown in FIG. 7, in accordance with some embodiments of the present disclosure.

FIG. 7 is a flow diagram of another exemplary method 700 for inserting a Gr film for a contact in a FET, in accordance with some embodiments of the present disclosure. FIGS. 8A-8C illustrate schematic cross-sectional views of a portion of an exemplary FET at certain fabricating stages of the method shown in FIG. 7, according to some embodiments of the present disclosure. Method 700 does not produce completed FET 100. Accordingly, it is understood that the operations shown in FIG. 7 are not exhaustive and that other operations can be performed before, after, or between any of the illustrated operations, and that some other processes may only be briefly described herein.

In operation 710, a retentive catalyst layer can be deposited in an opening that penetrates a dielectric layer and an etch stop layer and exposes a top surface of an epitaxial layer. The retentive catalyst layer can be used as a catalyst for graphene growth and as a seed layer for metal deposition in the subsequent operations.

Similar to method 500, in some embodiments, before operation 710, EPI 610 can be epitaxially grown on a semiconductor material, ESL 620 can be formed on a top surface of EPI 610, ILD 630 can be formed on ESL 620, and an opening 690 can be formed in ESL 620 and ILD 630 to expose a top surface of EPI 610. Different from operation 510, in operation 710, a retentive catalyst layer 840 can be formed to cover the bottom surface and sidewalls of the opening 690. Retentive catalyst layer 840 can include the same metal material as the metal plug in a subsequent process, such as Co, W, and Ru. A process of forming retentive catalyst layer 840 can be similar to the deposition of sacrificial catalyst layer 640, and be similar to operation 510 described above.

In operation 720, a Gr film can be formed at the interfaces between the retentive catalyst layer and the dielectric layer/etch stop layer/epitaxial layer. A process of forming Gr film 650 can be similar to operation 520 described above.

In operation 730, a metal plug can be formed on the retentive catalyst layer to fill the opening. Since retentive catalyst layer 840 can include the same metal material as the metal plug, it is not removed, as shown in FIG. 8B. A deposition process can be performed to fill the same metal material, such as Co, W, and Ru, into opening 690 to form metal plug 860. A subsequent CMP process can be performed to etch back the deposited metal plug to substantially coplanarize top surfaces of ILD 630, retentive catalyst layer 840, Gr film 650, and metal plug 860, as shown in FIG. 8C.

Method 700 (corresponding to FIGS. 7 and 8A-8C) is directed to a method for inserting a Gr film for a S/D contact as an example. Method 700 can be extendible to insert a Gr film for any suitable vias, such as those in a metal layer BEOL fill process.

Figure 9:
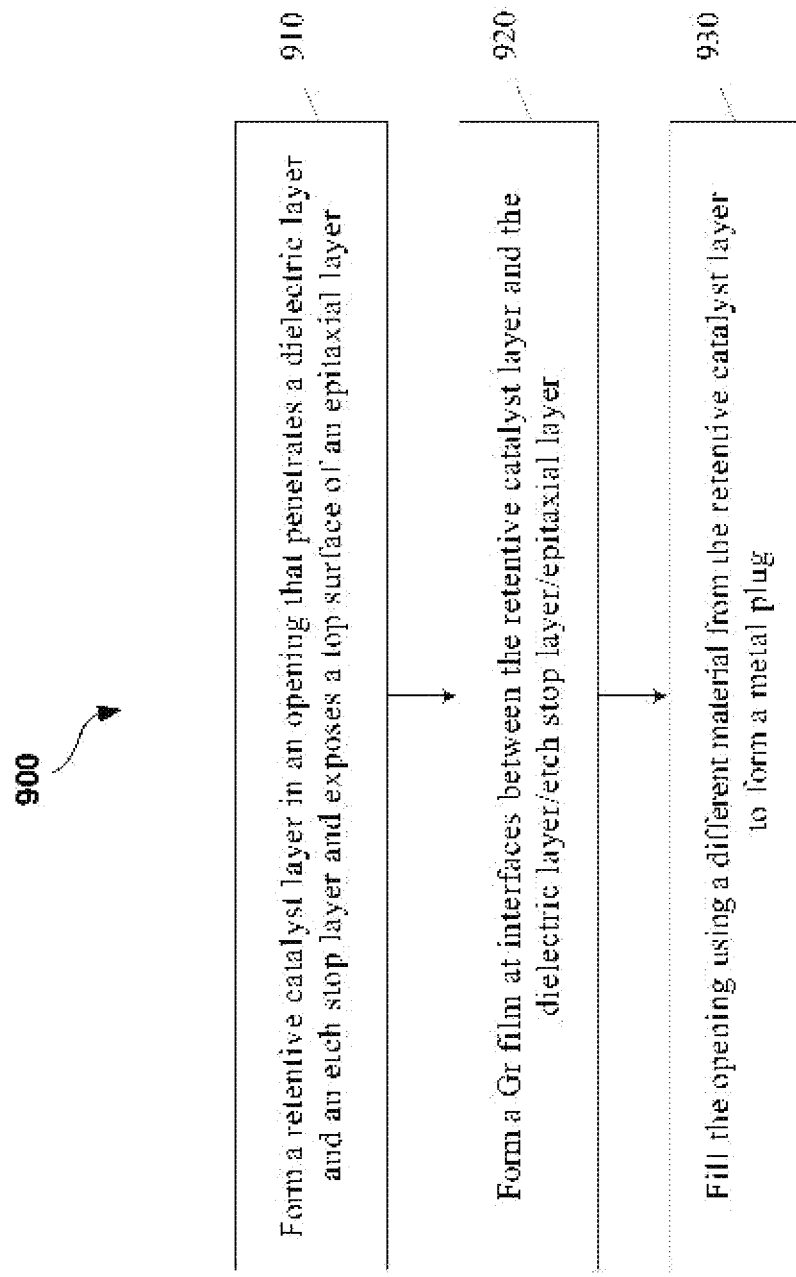
FIG. 9 is a flow diagram of an exemplary method for inserting a graphene film for a contact in a FET, in accordance with some embodiments of the present disclosure.

FIG. 9 is a flow diagram of another exemplary method 900 for inserting a Gr film for a contact in a FET, in accordance with some embodiments of the present disclosure. FIGS. 10A-10D illustrate schematic cross-sectional views of a portion of an exemplary FET at certain fabricating stages of the method shown in FIG. 9, according to some embodiments of the present disclosure. Method 900 does not produce completed FET 100. Accordingly, it is understood that the operations shown in FIG. 9 are not exhaustive and that other operations can be performed before, after, or between any of the illustrated operations, and that some other processes may only be briefly described herein.

In operation 910, a retentive catalyst layer can be deposited in an opening that penetrates a dielectric layer and an etch stop layer and exposes a top surface of an epitaxial layer. The retentive catalyst layer can be used as a catalyst for graphene growth and as a seeding layer for metal deposition in subsequent processes.

Similar to method 700, in some embodiments, before operation 910, EPI 610 can be epitaxially grown on a semiconductor material, ESL 620 can be formed on a top surface of EPI 610, ILD 630 can be formed on ESL 620, and opening 690 can be formed in ESL 620 and ILD 630 to expose a top surface of EPI 610. In operation 910, a retentive catalyst layer 1040 can be formed to cover the bottom surface and sidewalls of the opening 690. Different from operation 710, retentive catalyst layer 1040 can include Ru or RuCo which can act as a liner. A process of forming retentive catalyst layer 1040 can be similar to the deposition of sacrificial catalyst layer 640, and be similar to operation 510 described above.

In operation 920, a Gr film can be formed at the interfaces between the retentive catalyst layer and the dielectric layer/etch stop layer/epitaxial layer. A process of forming Gr film 650 can be similar to operation 520 described above. During the annealing process, the Ru atoms and/or Co atoms in retentive seeding layer 1040 can be rearranged, which is referred as a coalescence process. The coalescence process can have three stages: the nucleation, the growth on account of dissolved matter, and the recondensation growth when the largest particles grow at dissolution of the smaller ones. During the first stage, the nuclei appear but do not grow in size. The decrease of the solution oversaturation during the nucleation initiates the second stage of the phase decomposition process. During the second stage, the number of particles does not change but their size increases. The critical radius of the nuclei increases with the increase of the annealing temperature (decreasing oversaturation). Moreover, the mean radius of the particles in the nucleation stage grows as a square root of the duration of annealing. A cubic root dependence of mean size on the annealing duration has been observed in the recondensation stage. Thus, the size of nanoparticles grown during the diffusion-controlled phase decomposition of oversaturated solid solutions is varied by controlling the temperature and/or the duration of heat treatment.

Figure 10B:
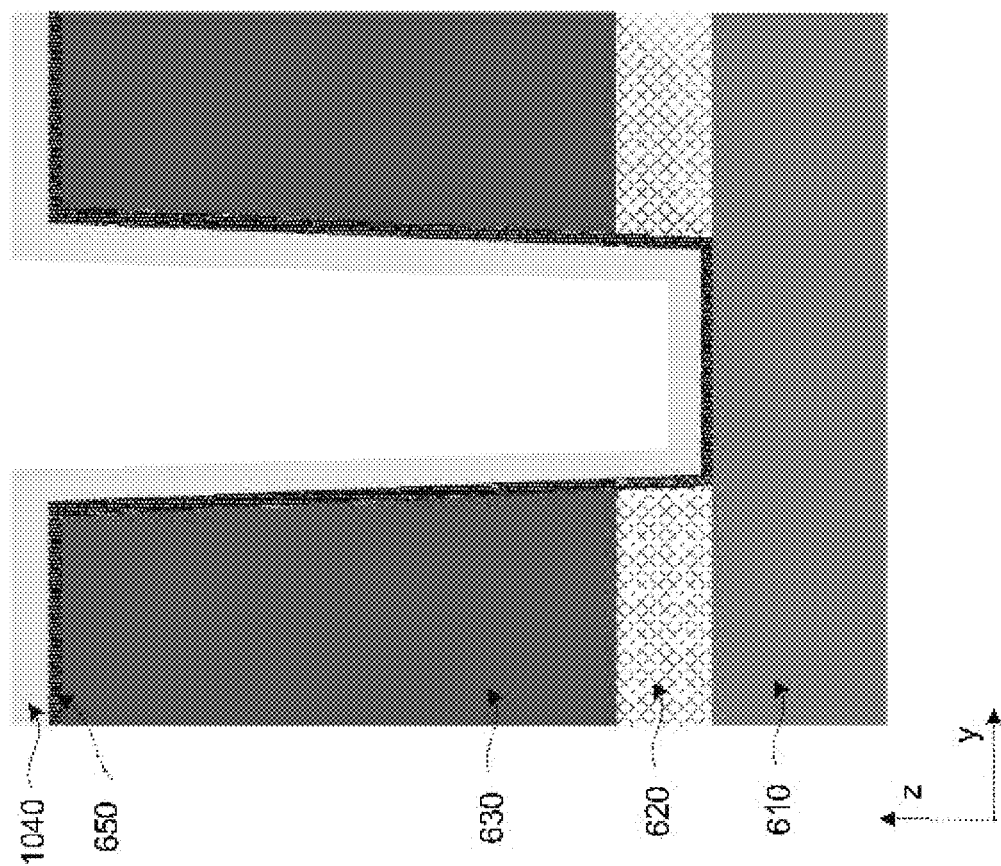
FIGS. 10A-10D are cross-sectional views of a portion of an exemplary FET at certain fabricating stages of the method shown in FIG. 9, in accordance with some embodiments of the present disclosure.
Figure 10A:
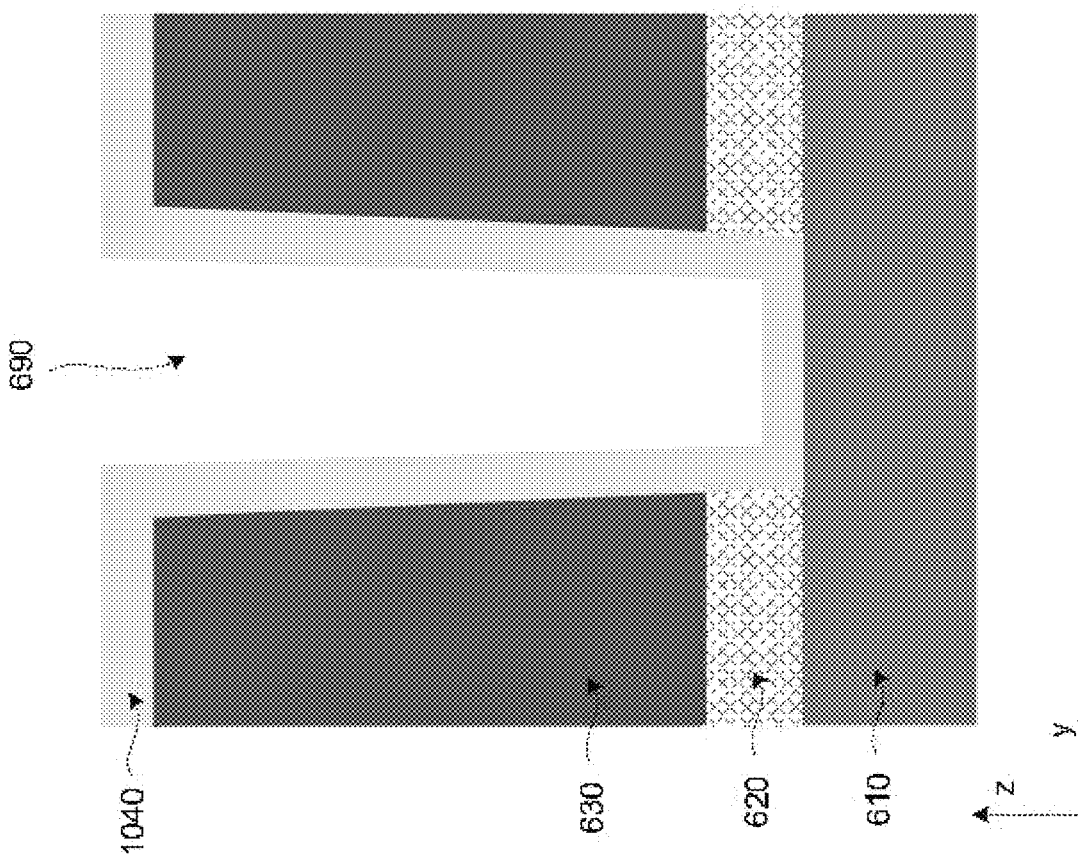
Figure 10D:
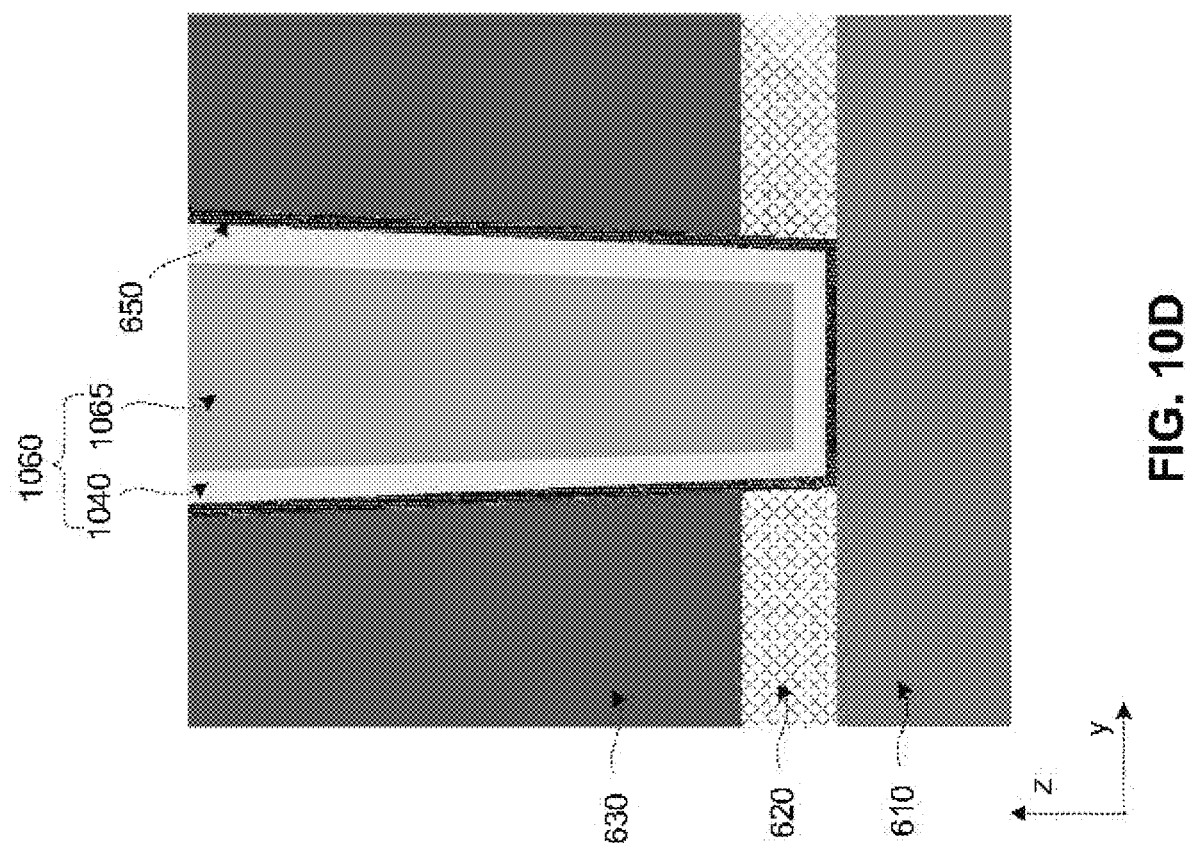
Figure 10C:
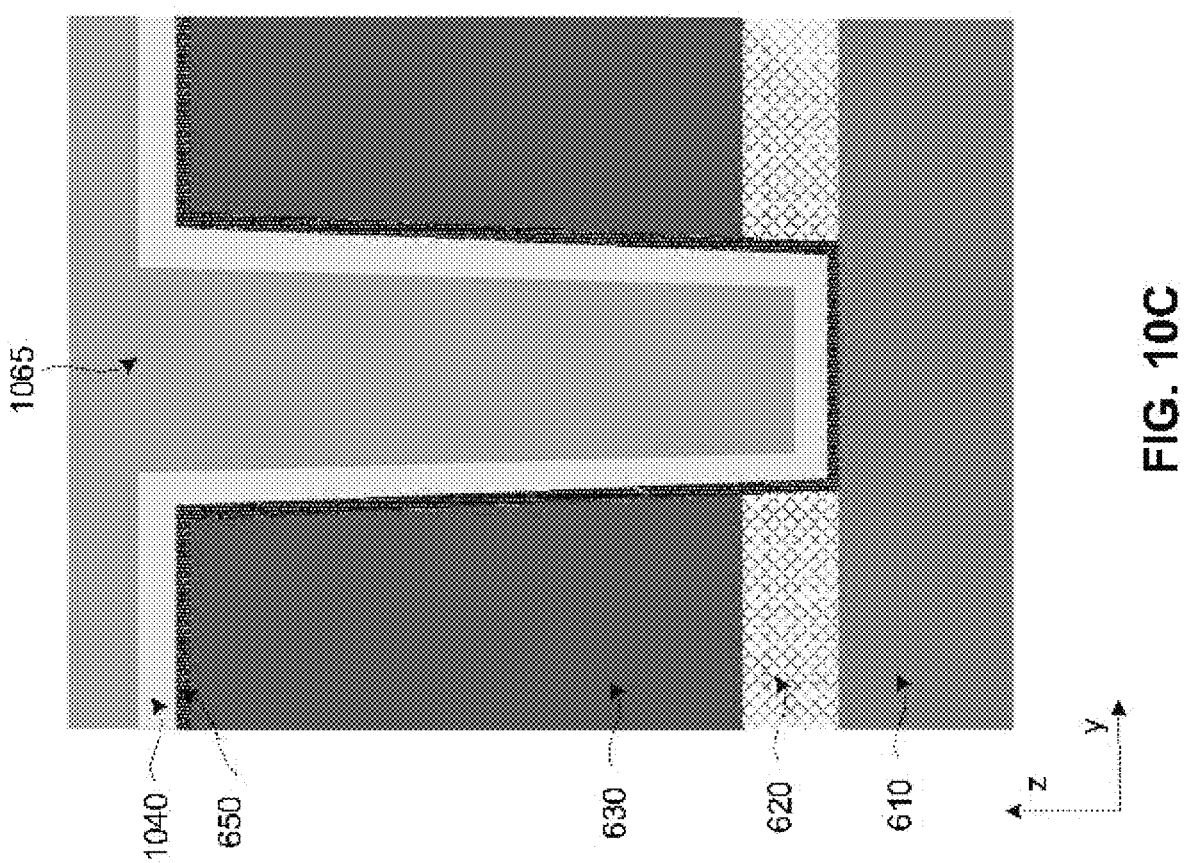

In operation 930, a metal plug can be formed on the retentive catalyst layer to fill the opening. Since retentive catalyst layer 1040 acts as a seeding layer, it is not removed, as shown in FIG. 10B. A deposition process can be performed to fill a metal material, such as Co, W, and Ru, into opening 690 to form a metal layer 1065, as shown in FIG. 10C. A subsequent CMP process can be performed to etch back the metal layer 1065 and remove portions of Gr film 650 and retentive seeding layer 1040 located outside of opening 690. The top surfaces of ILD 630, retentive seeding layer 1040, Gr film 650, and metal layer 1065 can be substantially coplanarized. The remaining portions of retentive seeding layer 1040 and metal layer 1065 inside opening 690 can form metal plug 1060, as shown in FIG. 10D.

Figure 11:
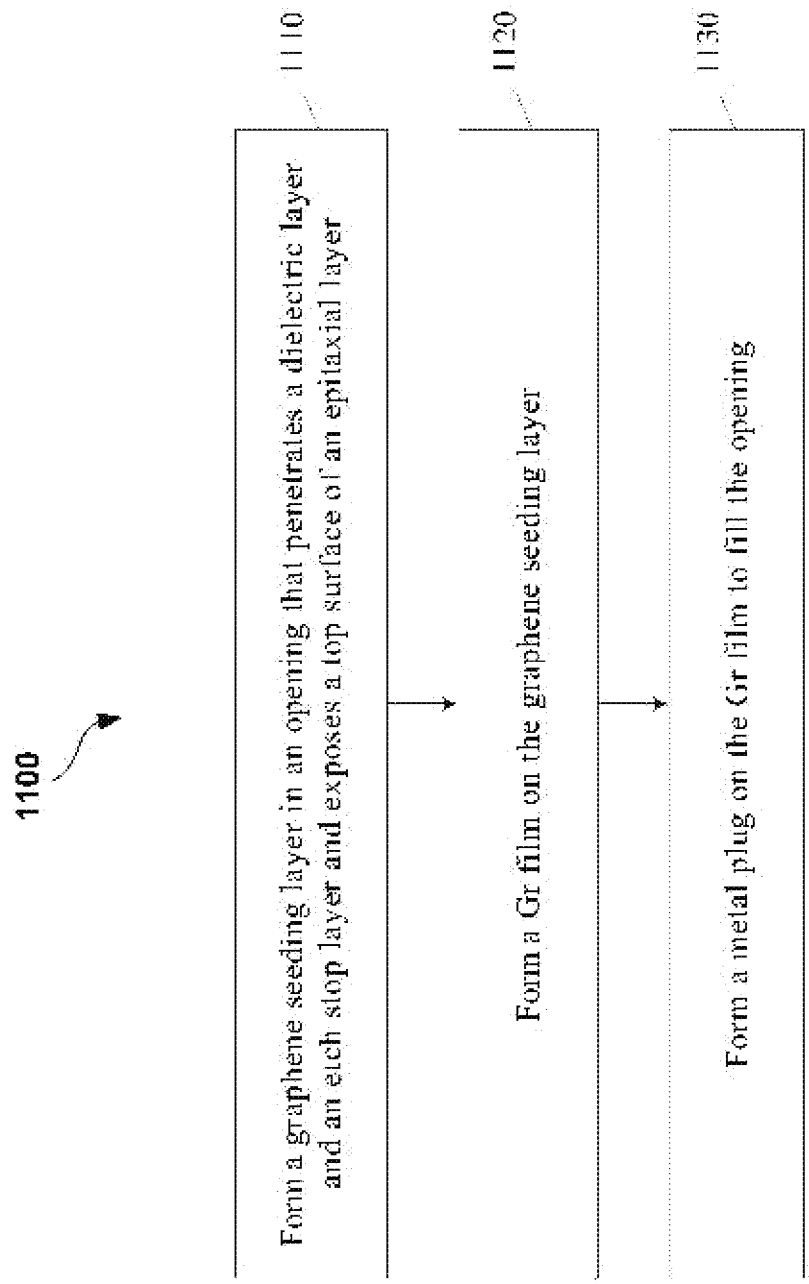
FIG. 11 is a flow diagram of an exemplary method for inserting a graphene film for a contact in a FET, in accordance with some embodiments of the present disclosure.

FIG. 11 is a flow diagram of another exemplary method 1100 for inserting a Gr film for a contact in a FET, in accordance with some embodiments of the present disclosure. FIGS. 12A-12D illustrate schematic cross-sectional views of a portion of an exemplary FET at certain fabricating stages of the method shown in FIG. 11, according to some embodiments of the present disclosure. Method 1100 does not produce completed FET 100. Accordingly, it is understood that the operations shown in FIG. 11 are not exhaustive and that other operations can be performed before, after, or between any of the illustrated operations, and that some other processes may only be briefly described herein.

In operation 1110, a graphene seeding layer can be formed in an opening that penetrates a dielectric layer and an etch stop layer and exposes a top surface of an epitaxial layer. The graphene seeding layer can be used as a seed for graphene growth in a subsequent process.

Similar to method 500, in some embodiments, before operation 1110, EPI 610 can be epitaxially grown on a semiconductor material, ESL 620 can be formed on a top surface of EPI 610, ILD 630 can be formed on ESL 620, and opening 690 can be formed in ESL 620 and ILD 630 to expose a top surface of EPI 610.

In operation 1110, a graphene seeding layer 1255 can be formed to cover the bottom surface and sidewalls of opening 690. In some embodiments, graphene seeding layer 1255 can be formed by a gas phase synthesis process or a spin coating process by using 1,2,3,4-tetraphenylnaphthalene (TPN), Pyrene, or Benzene as the carbon source.

In the gas phase synthesis process, a thin Gr film can be synthesized by sending an aerosol consisting of argon gas and liquid ethanol droplets into an atmospheric-pressured, microwave-generated argon plasma field. The ethanol droplets can be evaporated and dissociated in the plasma to form a thin Gr film that is clean and highly ordered with few lattice imperfections and oxygen functionalities, which can have improved seed characteristics for subsequent graphene growth.

The spin coating process can include four stages: deposition, spin up, spin off, and evaporation. In the deposition stage, an aqueous dispersion of functionalized graphene solution can be deposited on the coated surface and then spun up and spun off occur in sequence while the evaporation stage occurs throughout the process. The applied solution on the turntable is distributed via centrifugal force. A high spinning speed results in thinning of the graphene layer. This stage is followed by drying off the graphene layer. Uniform evaporation of the solvent is possible because of rapid rotation. High volatile components are removed due to evaporation or drying and the low volatile carbon atoms remain on the surface. Thickness of the graphene layer is controlled by the viscosity of the coating solution and the speed of rotation.

Figure 12B:
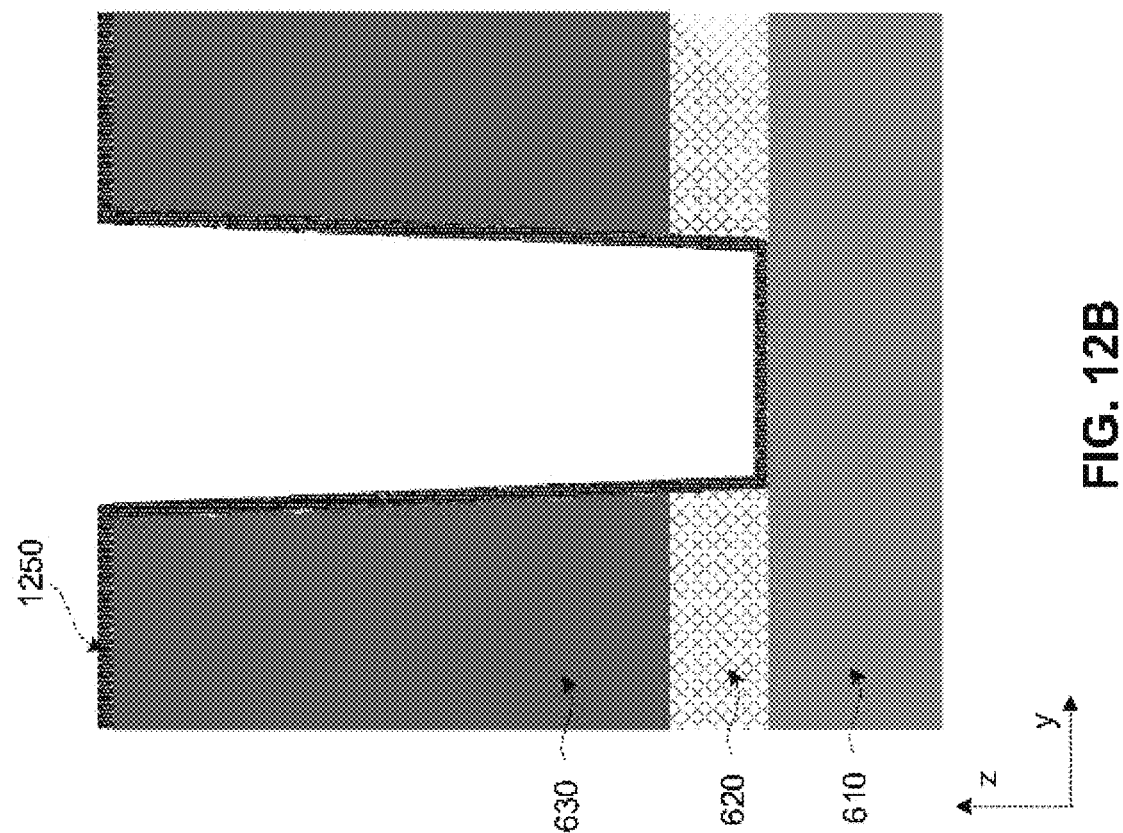
FIGS. 12A-12D are cross-sectional views of a portion of an exemplary FET at certain fabricating stages of the method shown in FIG. 11, in accordance with some embodiments of the present disclosure.
Figure 12A:
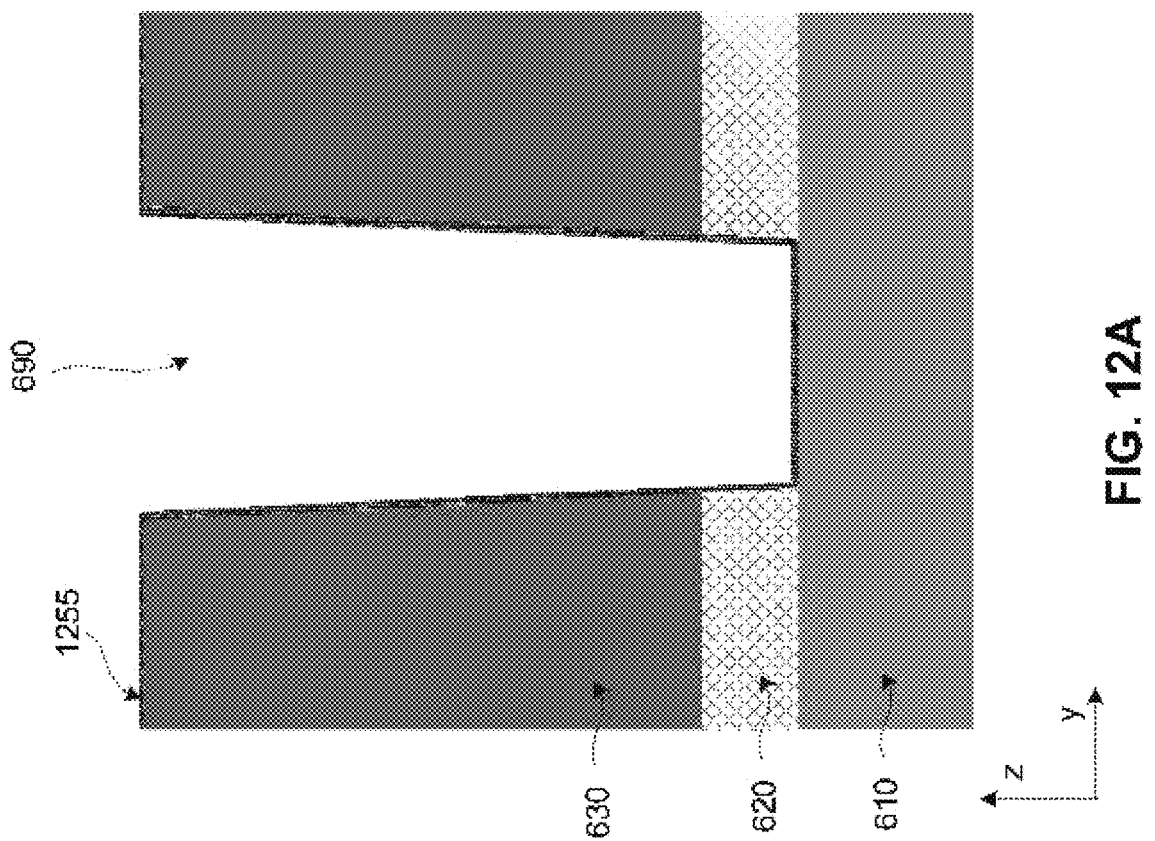

In operation 1120, a Gr film can be formed on the graphene seeding layer. In some embodiments, any suitable method of activation and graphene growth, such as an ultraviolet (UV) cure, laser treatment, and thermal anneal, can be applied to the graphene seeding layer 1255 deposited from graphene dissolved in solution at operation 1110 to form Gr film 1250, as shown in FIG. 12B.

In some embodiments, a heat treatment may be performed in an inert atmosphere of argon, nitrogen, or helium for solvent removal. For example, in a UV curing process, graphene seeding layer 1255 can be irradiated by high-intensity ultraviolet light to rapidly cure the graphene atoms. As another example, a pulsed laser or a continuous wave laser source having a wavelength and intensity to heat graphene seeding layer 1255 can be used in a laser treatment for activation and graphene growth. As yet another example, a thermal activation annealing process at an annealing temperature in a range from about 380° C. to about 450° C. (e.g., about 400° C.) can be performed to drive precipitation and growth of carbon atoms.

Figure 12D:
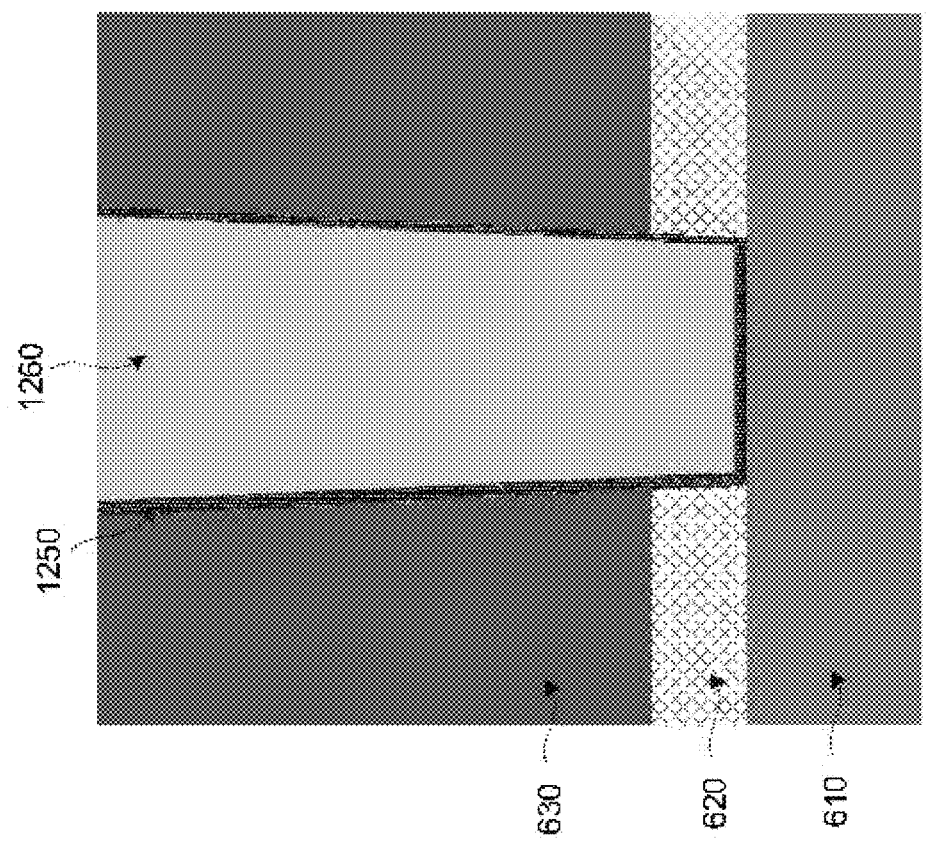
Figure 12C:
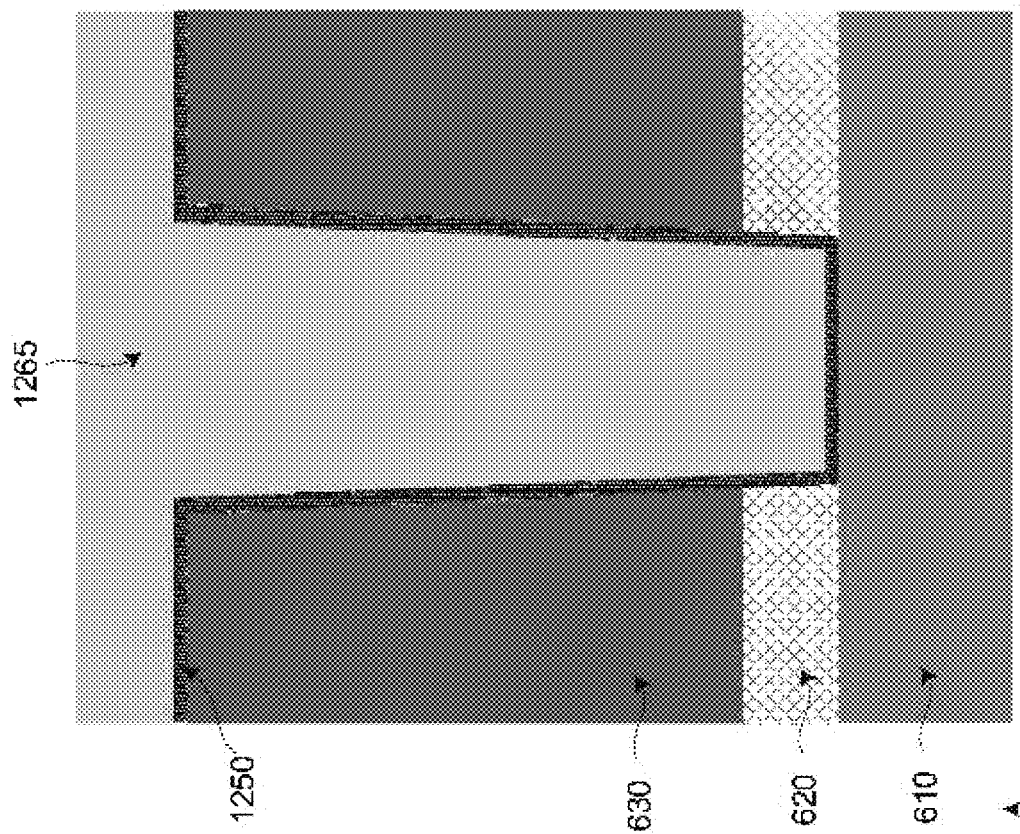

In operation 1130, a metal plug can be formed on the Gr film to fill the opening. A deposition process can be performed to fill a metal material, such as Co, W, and Ru, into opening 690 to form metal layer 1265, as shown in FIG. 12C. A subsequent CMP process can be performed to etch back metal layer 1265 and remove portions of Gr film 1250 located outside of opening 690. The top surfaces of ILD 630, Gr film 1250, and metal layer 1265 can be substantially coplanarized. The remaining portion of the metal layer inside opening 690 can form metal plug 1260, as shown in FIG. 12D.

Figure 13:
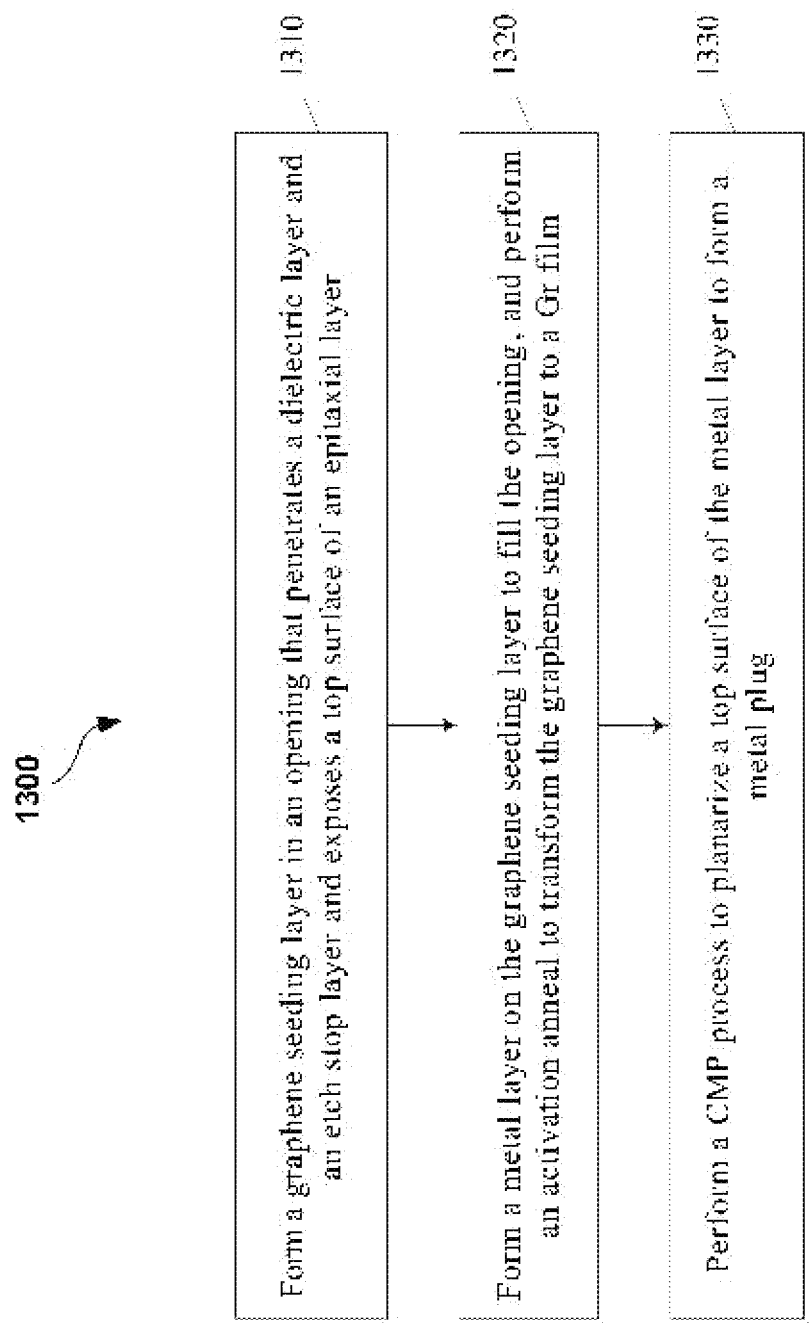
FIG. 13 is a flow diagram of an exemplary method for inserting a graphene film for a contact in a FET, in accordance with some embodiments of the present disclosure.

FIG. 13 is a flow diagram of another exemplary method 1300 for inserting a Gr film for a contact in a FET, in accordance with some embodiments of the present disclosure. FIGS. 14A-14D illustrate schematic cross-sectional views of a portion of an exemplary FET at certain fabricating stages of the method shown in FIG. 13, according to some embodiments of the present disclosure. Method 1300 does not produce completed FET 100. Accordingly, it is understood that the operations shown in FIG. 13 are not exhaustive and that other operations can be performed before, after, or between any of the illustrated operations, and that some other processes may only be briefly described herein.

In operation 1310, a graphene seeding layer can be deposited in an opening that penetrates a dielectric layer and an etch stop layer and exposes a top surface of an epitaxial layer. The graphene seeding layer can be used as a seed for graphene growth in a subsequent process.

Similar to method 500, in some embodiments, before operation 1310, EPI 610 can be epitaxially grown on a semiconductor material, ESL 620 can be formed on a top surface of EPI 610, ILD 630 can be formed on ESL 620, and opening 690 can be formed in ESL 620 and ILD 630 to expose a top surface of EPI 610.

Similar to operation 1110, in operation 1310, a graphene seeding layer 1455 can be formed to cover the bottom surface and sidewalls of opening 690. In some embodiments, graphene seeding layer 1455 can be formed by a gas phase synthesis process or a spin coating process by using TPN, Pyrene, or Benzene as the carbon source.

Figure 14B:
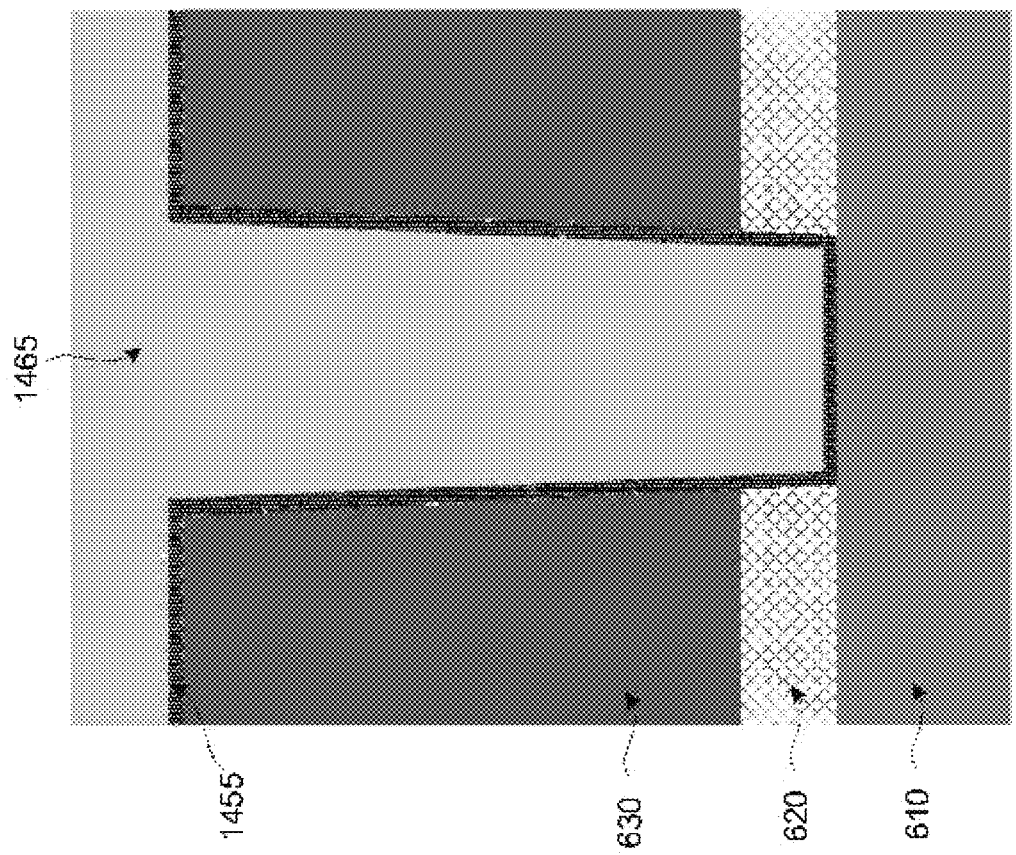
FIGS. 14A-14D are cross-sectional views of a portion of an exemplary FET at certain fabricating stages of the method shown in FIG. 13, in accordance with some embodiments of the present disclosure.
Figure 14A:
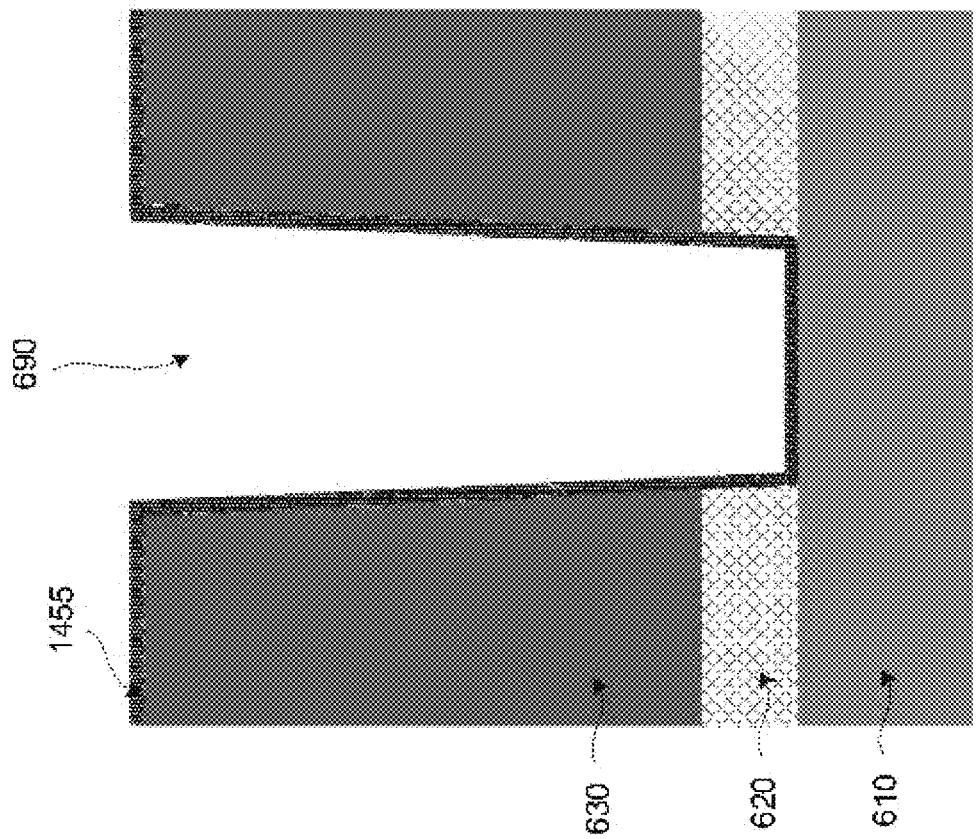
Figure 14D:
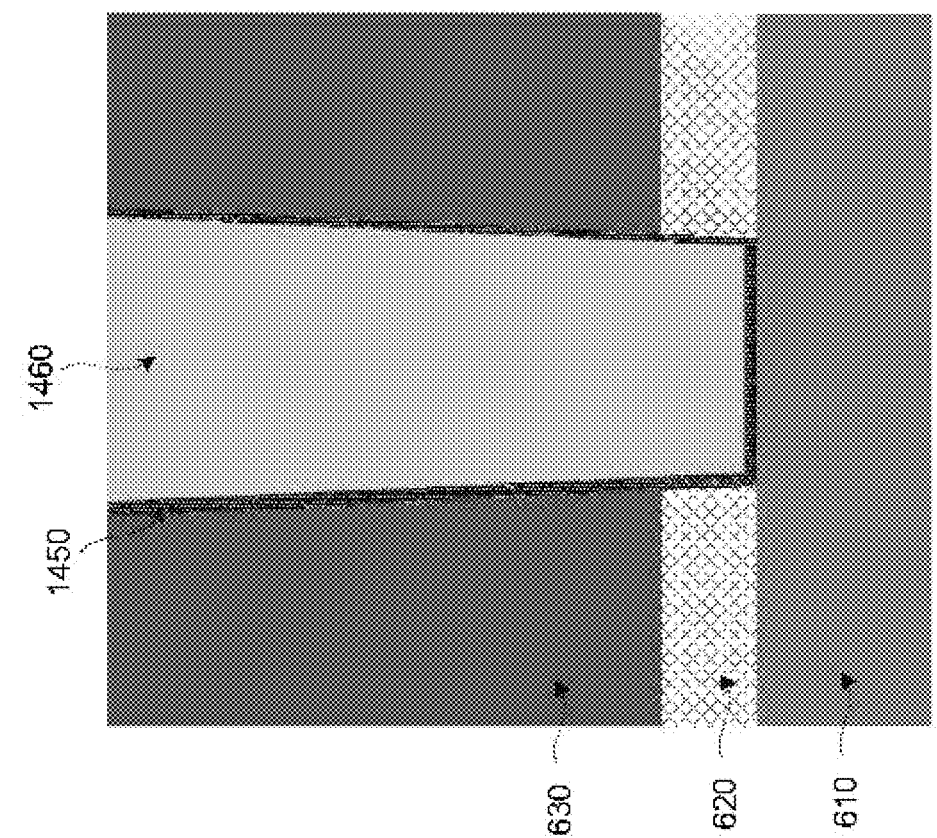
Figure 14C:
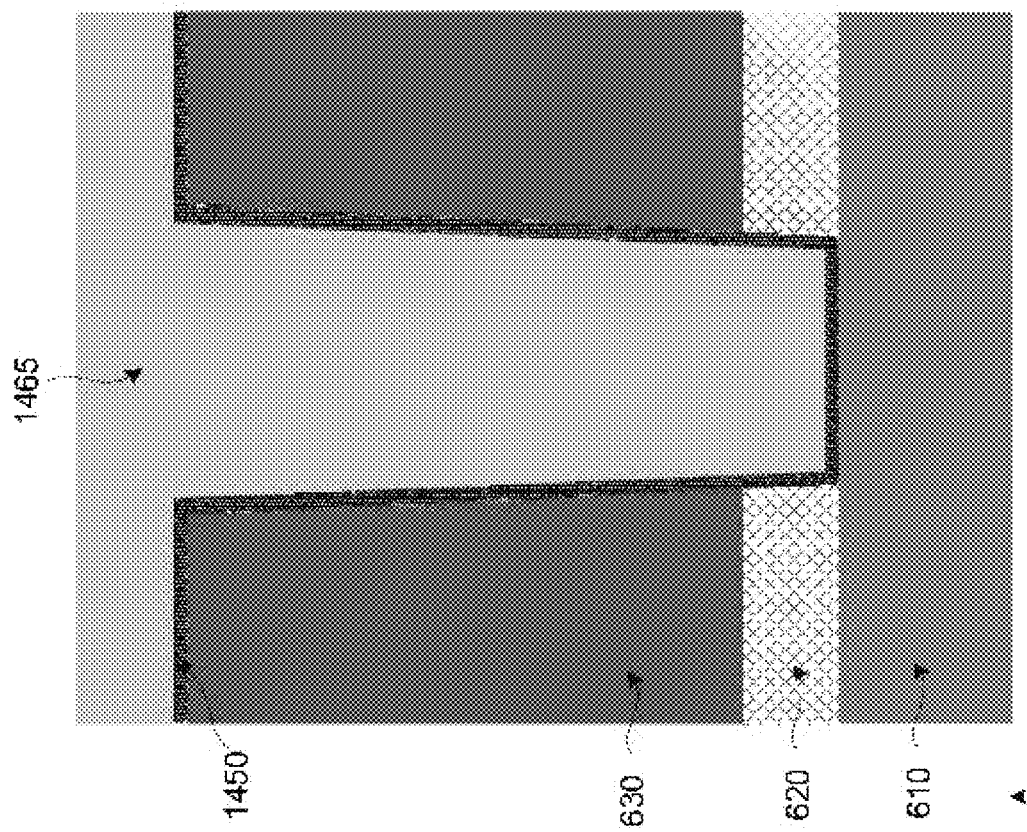

In operation 1320, a metal layer can be formed on the graphene seeding layer to fill the opening, and an activation anneal process can be performed to transform the graphene seeding layer to a Gr film. For example, a deposition process can be performed to fill a metal material, such as Co, W, and Ru, into opening 690 to form metal layer 1465, as shown in FIG. 14B. A subsequent activation anneal process at an annealing temperature in a range from about 380° C. to about 450° C. (e.g., about 400° C.) in Ar or in vacuum can be performed to drive precipitation and growth of carbon atoms of graphene seeding layer 1455. Gr film 1450 can be formed at the interfaces between metal layer 1465 and EPI 610/ESL 620/ILD 630, as shown in FIG. 14C.

In operation 1330, a CMP process can be performed to planarize a top surface of the metal layer to form a metal plug. As shown in FIG. 14D, a CMP process can be performed to etch back metal layer 1465 and remove portions of Gr film 1450 located outside of opening 690. The top surfaces of ILD 630, Gr film 1450, and metal plug 1460 can be substantially coplanarized.

Figure 15:
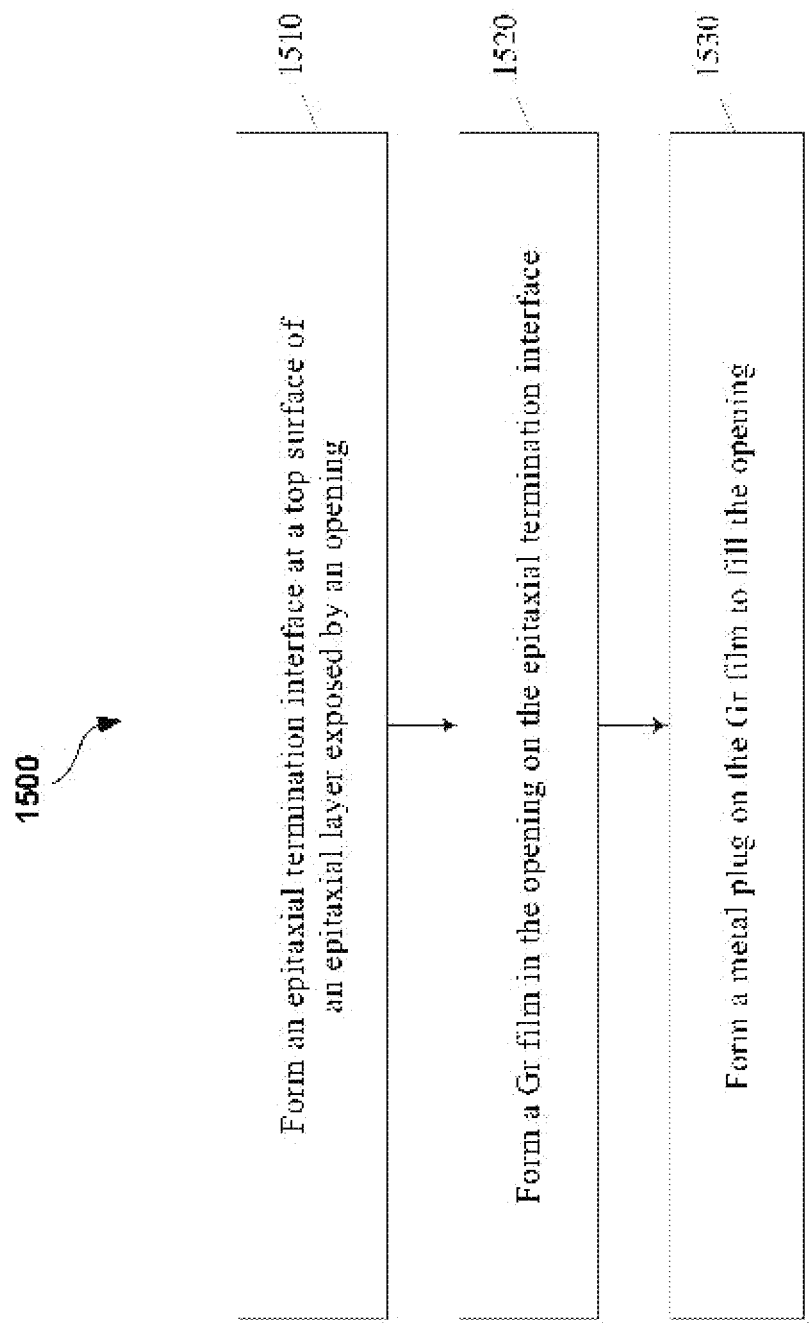
FIG. 15 is a flow diagram of an exemplary method for inserting a graphene film for a contact in a FET, in accordance with some embodiments of the present disclosure.
Figure 16:
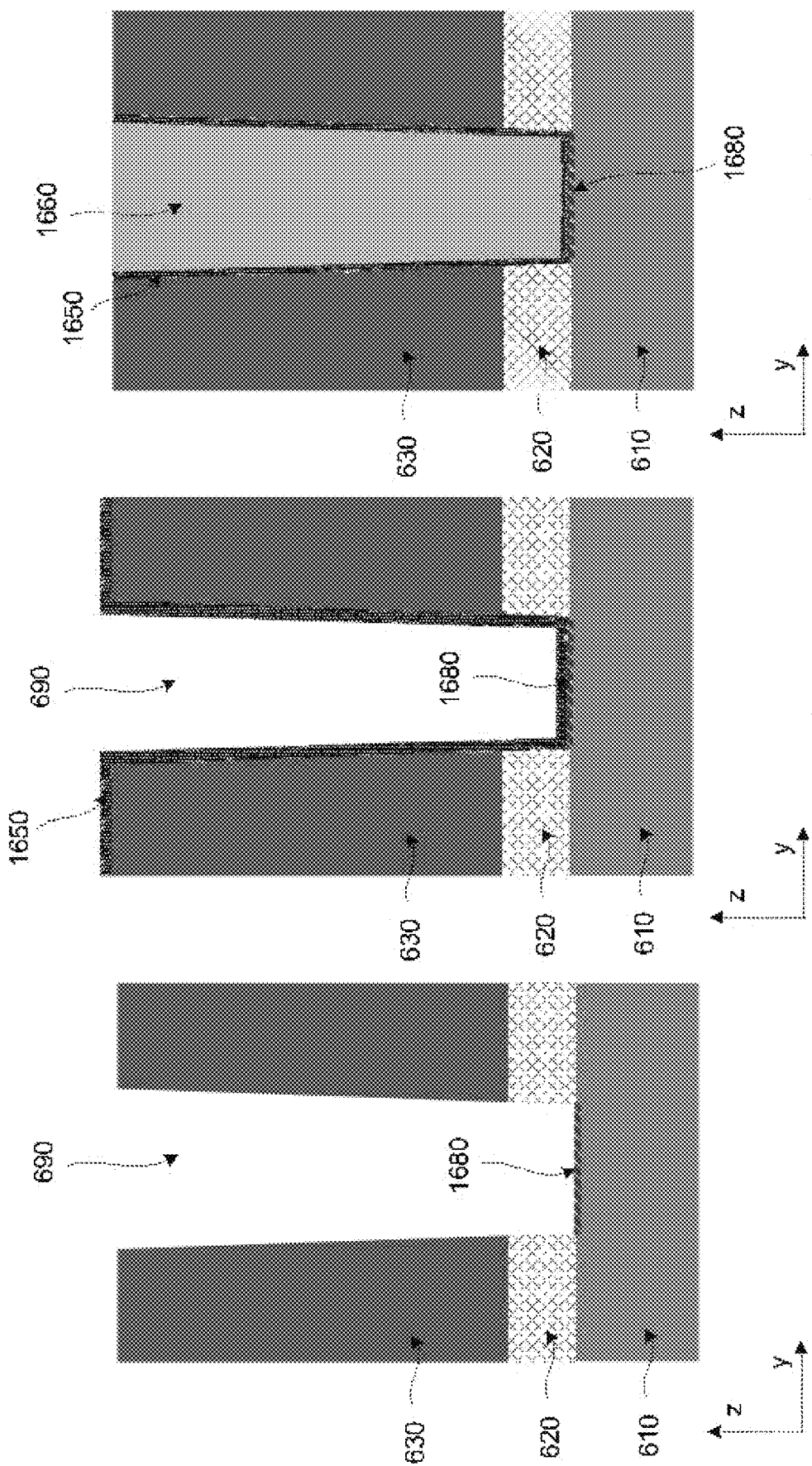
FIGS. 16A-16C are cross-sectional views of a portion of an exemplary FET at certain fabricating stages of the method shown in FIG. 15, in accordance with some embodiments of the present disclosure.

FIG. 15 is a flow diagram of another exemplary method 1500 for inserting a Gr film for a contact in a FET, in accordance with some embodiments of the present disclosure. FIGS. 16A-16C illustrate schematic cross-sectional views of a portion of an exemplary FET at certain fabricating stages of the method shown in FIG. 15, according to some embodiments of the present disclosure. Method 1500 does not produce completed FET 100. Accordingly, it is understood that the operations shown in FIG. 15 are not exhaustive and that other operations can be performed before, after, or between any of the illustrated operations, and that some other processes may only be briefly described herein.

In operation 1510, a surface treatment can be performed to a bottom surface of an opening that penetrates a dielectric layer and an etch stop layer to form an epitaxial termination interface at a top surface of an epitaxial layer exposed by the opening.

Similar to method 500, in some embodiments, before operation 1510, EPI 610 can be epitaxially grown on a semiconductor material, ESL 620 can be formed on a top surface of EPI 610, ILD 630 can be formed on ESL 620, and opening 690 can be formed in ESL 620 and ILD 630 to expose a top surface of EPI 610.

A surface treatment process can be used to treat the top surface of EPI 610 that is exposed by opening 690 to form an epitaxial termination interface 1680 at the bottom of opening 690 and on EPI 610, as shown in FIG. 16A. In some embodiments, the top surface of EPI 610 may treated with non-deposited plasma products. The treated surface nucleates polysilicon and poly-SiGe. The surface treatment provides surface moieties susceptible to a subsequent deposition reaction or susceptible to further surface treatment prior to deposition. By changing the top surface of EPI 610 to an epitaxial termination interface 1680, the SBH between EPI 610 and subsequently formed metal plug can be reduced.

In operation 1520, a Gr film can be formed in the opening on the epitaxial termination interface. In some embodiments, a graphene seeding layer can be formed to cover the bottom surface and sidewalls of opening 690. In some embodiments, the graphene seeding layer can be formed by a gas phase synthesis process or a spin coating process by using TPN, Pyrene, or Benzene as the carbon source. A subsequent heat treatment, such as a UV curing process, may be performed to drive precipitation and growth of carbon atoms of the graphene seeding layer to form Gr film 1650, as shown in FIG. 16B.

In operation 1530, a metal plug can be formed on the Gr film to fill the opening. A deposition process can be performed to fill a metal material, such as Co, W, and Ru, into opening 690 to form a metal layer. A subsequent CMP process can be performed to etch back the metal layer and remove portions of Gr film 1650 located outside of opening 690. The top surfaces of ILD 630, Gr film 1650, and metal plug 1660 can be substantially coplanarized. As shown in FIG. 16C, a portion of Gr film 1650 and the epitaxial termination interface 1680 can be located between metal plug 1660 and EPI 610.

Figure 17:
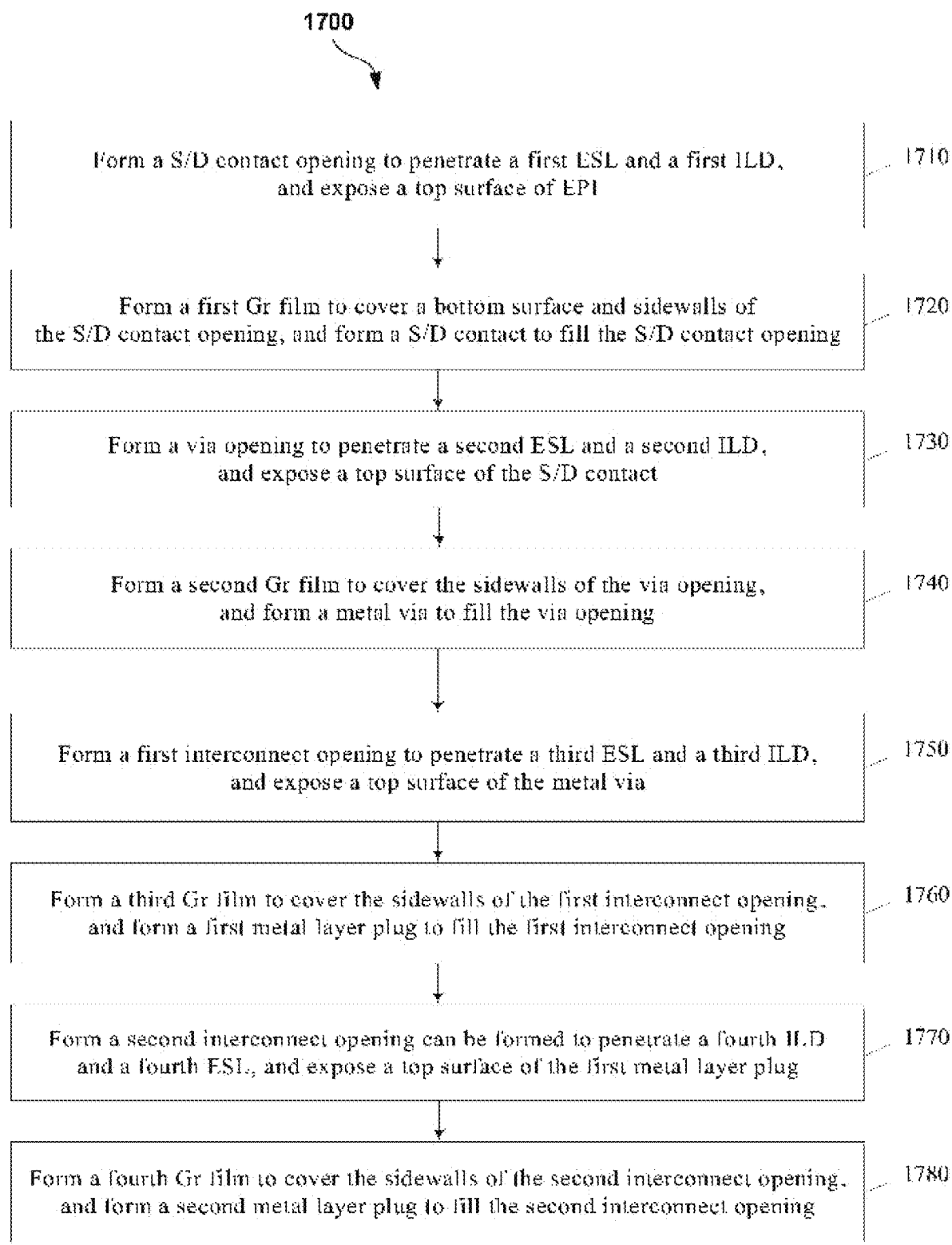
FIG. 17 is a flow diagram of an exemplary method for forming an interconnect structure of a FET, in accordance with some embodiments of the present disclosure.
Figure 18:
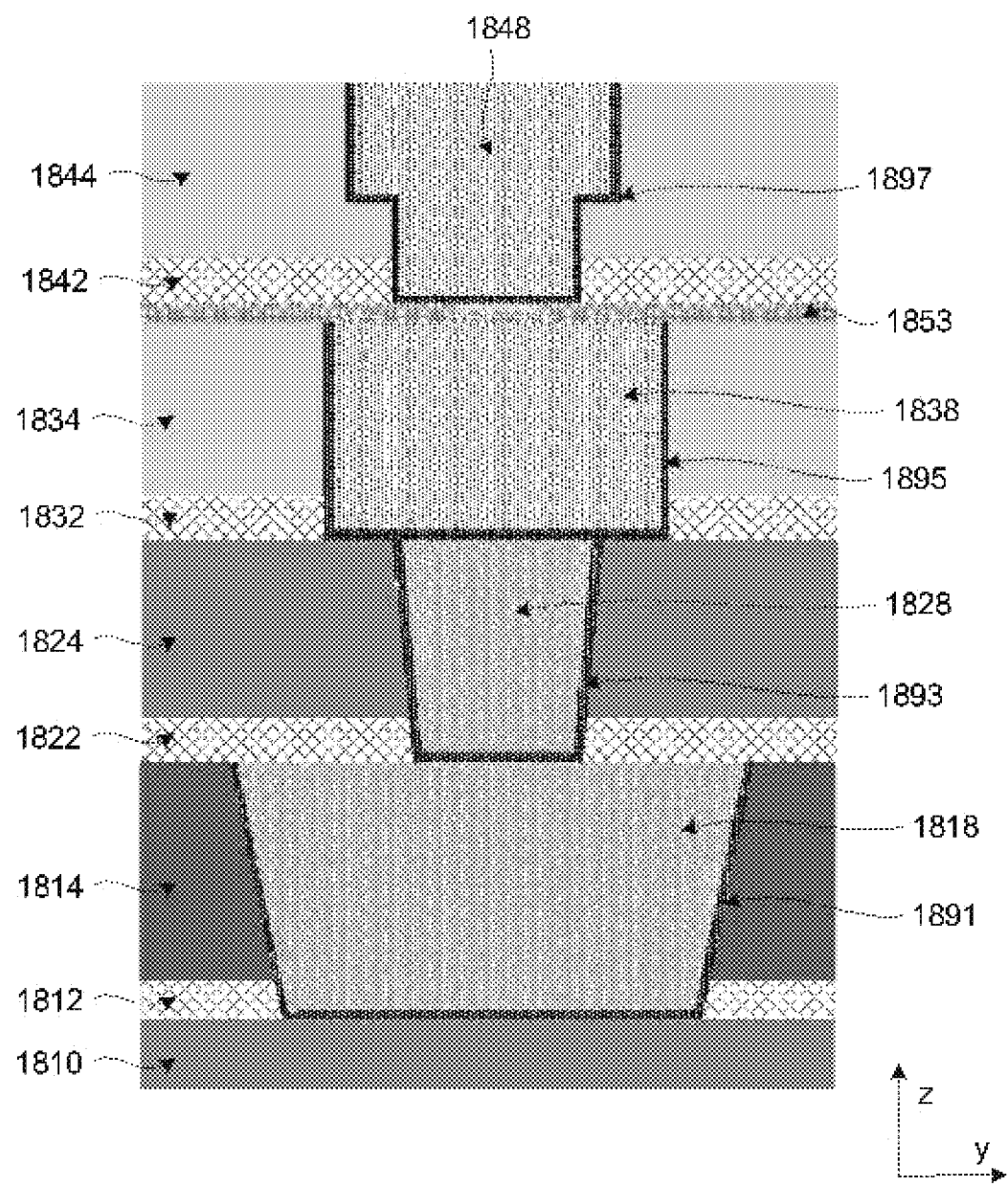
FIG. 18 is a cross-sectional view of an exemplary interconnect structure of a FET formed by the method shown in FIG. 17, in accordance with some embodiments of the present disclosure.

FIG. 17 is a flow diagram of an exemplary method 1700 for forming an interconnect structure 1800 of a FET, in accordance with some embodiments of the present disclosure. FIG. 18 illustrates a schematic cross-sectional view of an exemplary interconnect structure of a FET formed by the method shown in FIG. 17, according to some embodiments of the present disclosure. Operations shown in FIG. 17 are not exhaustive and that other operations can be performed before, after, or between any of the illustrated operations, and that some other processes may only be briefly described herein.

In operation 1710, an epitaxial layer EPI 1810, a first ESL 1812, and a first ILD 1814 can be stacked in a vertical direction, and a S/D contact opening can be formed to penetrate first ESL 1812 and first ILD 1814 and expose a top surface of EPI 1810.

In some embodiments, EPI 1810 can be epitaxially grown on a semiconductor material, first ESL 1812 can be formed on a top surface of EPI 1810, and first ILD 1814 can be a high-k dielectric layer formed on first ESL 1812. In some embodiments, a S/D contact opening can be formed to penetrate first ESL 1812 and first ILD 1814 to expose a top surface of EPI 1810. The S/D contact opening can be formed by any suitable patterning process. For example, a lithography process can be performed to pattern a mask for the opening and one or more subsequent wet or dry etching processes can be performed to etch a portion of first ESL 1812 and first ILD 1814 exposed by the patterned mask. A cleaning process, such as an ashing process and a strip process, can be performed after the etching to clean the sidewalls and bottom surface of the S/D contact opening.

In operation 1720, a first Gr film 1891 can be formed to cover the bottom surface and sidewalls of the S/D contact opening, and S/D contact 1818 can be formed to fill the S/D contact opening. A CMP process can be performed to coplanarize top surfaces of first ILD 1814, first Gr film 1891, S/D contact 1818.

In some embodiments, first Gr film 1891 and S/D contact 1818 can be formed by method 500 described above in connection with FIGS. 5 and 6A-6D. In such embodiments, a material of the sacrificial catalyst layer can be Ni, etc., and a material of the S/D contact 1818 can be Mo, Co, Ru, W, etc. In some embodiments, first Gr film 1891 and S/D contact 1818 can be formed by method 700 described above in connection with FIGS. 7 and 8A-8C. In such embodiments, a material of the retentive catalyst layer and S/D contact 1818 can be Co, Ru, etc. In some embodiments, first Gr film 1891 and S/D contact 1818 can be formed by method 900 described above in connection with FIGS. 9 and 10A-10C. In such embodiments, a material of the retentive catalyst layer can be Ru, etc., and a material of S/D contact 1818 can be Co, W, Mo, etc.

In some embodiments, a thickness of first ESL 1812 is in a range between about 2 nm and about 4 nm, and a thickness of first Gr film 1891 is in a range from about 1 nm to about 4 nm. Thus, a ratio of the thickness of first Gr film 1891 and the thickness of first ESL 1812 is in a range between about 0.3 and about 2.

In operation 1730, a second ESL 1822 can be formed on first ILD 1814 and S/D contact 1818, a second ILD 1824 can be a high-k dielectric layer formed on second ESL 1822, and a via opening can be formed to penetrate second ESL 1822 and second ILD 1824 and expose a top surface of S/D contact 1818. The via opening can be formed by any suitable patterning process.

In operation 1740, a second Gr film 1893 can be formed to cover the sidewalls of the via opening, and a metal via 1828 can be formed to fill the via opening. A CMP process can be performed to coplanarize top surfaces of second ILD 1824, second Gr film 1893, and metal via 1828. In some embodiments, S/D contact 1818 and metal via 1828 may have the same metal material.

In some embodiments, second Gr film 1893 and metal via 1828 can be formed by method 500 described above in connection with FIGS. 5 and 6A-6D. In such embodiments, a material of the sacrificial catalyst layer can be Cu or Ni, and a material of metal via 1828 can be Mo, Co, Ru or W. In some embodiments, second Gr film 1893 and metal via 1828 can be formed by method 700 described above in connection with FIGS. 7 and 8A-8C. In such embodiments, a material of retentive catalyst layer and metal via 1828 can be Co or Ru. In some embodiments, second Gr film 1893 and metal via 1828 can be formed by method 900 described above in connection with FIGS. 9 and 10A-10C. In such embodiments, a material of the retentive catalyst layer is Ru, and a material of metal via 1828 can be Co, W or Mo.

In some embodiments, a thickness of second ESL 1822 is in a range between about 2 nm and about 4 nm, and a thickness of second Gr film 1893 is in a range from about 1 nm to about 4 nm. Thus, a ratio of the thickness of second Gr film 1893 and the thickness of second ESL 1822 is in a range between about 0.3 and about 2.

In some embodiments, the numbers of layers of carbon atoms of first Gr film 1891 and second Gr film 1893 can be determined based on structure stability of the interfaces between the first Gr film 1891 and S/D contact 1818, and between the second Gr film 1893 and the metal via 1828. When the materials of the S/D contact 1818 and the metal via 1828 are Co, W or Mo, the layers of carbon atoms of the first Gr film 1891 and second Gr film 1893 can be in a range from about 3 to about 7. Since the thicknesses of first Gr film 1891 and second Gr film 1893 are much less than the thickness of ordinary Ta/TaN liner and/or barrier used in other devices, thus allows more volume for S/D contact 1818 and the metal via 1828. If the thicknesses of first Gr film 1891 and second Gr film 1893 are below 1 nm, first Gr film 1891 and second Gr film 1893 may not adequately reduce contact resistance between S/D contact 1818 and the underlying structure, and between metal via 1828 and the underlying structure. On the other hand, if the thicknesses of first Gr film 1891 and second Gr film 1893 are greater than about 4 nm, the volume areas for S/D contact 1818 and the metal via 1828 decrease and consequently increase the contact resistivity. Further, when first Gr film 1891 and second Gr film 1893 each contains more than 7 layers of carbon atoms, the manufacturing complicity and cost also increase.

In operation 1750, a third ESL 1832 can be formed on second ILD 1824 and metal via 1828, a third ILD 1834 can be formed on third ESL 1832, and a first interconnect opening can be formed to penetrate third ESL 1832 and third ILD 1834 and expose a top surface of metal via 1828. The first interconnect opening can be formed by any suitable patterning process.

In operation 1760, a third Gr film 1895 can be formed to cover the sidewalls of the first interconnect opening, and a first metal layer plug 1838 can be formed to fill the first interconnect opening. A CMP process can be performed to coplanarize top surfaces of third ILD 1834, third Gr film 1895, and first metal layer plug 1838. A barrier layer 1853 can be formed on the coplanarized top surfaces of third ILD 1834, third Gr film 1895, and first metal layer plug 1838. In some embodiments, a material of first metal layer plug 1838 may be different from the material of S/D contact 1818 and metal via 1828.

In some embodiments, third Gr film 1895 and first metal layer plug 1838 can be formed by method 700 described above in connection with FIGS. 7 and 8A-8C. In such embodiments, a material of the retentive catalyst layer and first metal layer plug 1838 can be Cu. In some embodiments, third Gr film 1895 and first metal layer plug 1838 can be formed by method 900 described above in connection with FIGS. 9 and 10A-10C. In such embodiments, a material of the retentive catalyst layer is Ru, and a material of first metal layer plug 1838 can be Cu or Co. Barrier layer 1853 can be formed to cover the top surface of first metal layer plug 1838 to prevent metal diffusion. In some embodiments, barrier layer 1853 can include a thickness ranging from about 1 nm to about 2 nm. Below the thickness of 1 nm, barrier layer 1853 may not adequately prevent the metal diffusion of first metal layer plug 1838. On the other hand, if the thickness is greater than 2 nm, the processing time (e.g., oxidation time and/or nitridation time) for the formation of barrier layer 1853 increases, and consequently increases device manufacturing cost.

In some embodiments, a thickness of third ESL 1832 is in a range between about 1 nm to about 3 nm, and a thickness of third Gr film 1895 is in a range between about 0.3 nm to about 2 nm. Thus, a ratio of the thickness of third Gr film 1895 and the thickness of third ESL 1832 is in a range between about 0.1 and about 2.

In operation 1770, a fourth ESL 1842 can be formed on third ILD 1834 and first metal layer plug 1828, a fourth ILD 1844 can be formed on fourth ESL 1842, and a second interconnect opening can be formed to penetrate fourth ILD 1844 and fourth ESL 1842 and expose a top surface of first metal layer plug 1838. The second interconnect opening can be formed by any suitable patterning process and can include a capping region with a reduced width along a y-direction.

In operation 1780, a fourth Gr film 1897 can be formed to cover the sidewalls and corners of the second interconnect opening, and a second metal layer plug 1848 can be formed to fill the second interconnect opening. A CMP process can be performed to coplanarize top surfaces of fourth ILD 1844, fourth Gr film 1897, and second metal layer plug 1848. In some embodiments, first metal layer plug 1838 and second metal layer plug 1848 may have the same metal material.

In some embodiments, fourth Gr film 1897 and second metal layer plug 1848 can be formed by method 700 described above in connection with FIGS. 7 and 8A-8C. In such embodiments, a material of the retentive catalyst layer and second metal layer plug 1848 can be Cu. In some embodiments, fourth Gr film 1897 and second metal layer plug 1848 can be formed by method 900 described above in connection with FIGS. 9 and 10A-10C. In such embodiments, a material of the retentive catalyst layer is Ru, and a material of second metal layer plug 1848 can be Cu or Co.

In some embodiments, a thickness of fourth ESL 1842 is in a range between about 1 nm to about 3 nm, and a thickness of fourth Gr film 1897 is in a range between about 0.3 nm to about 2 nm. Thus, a ratio of the thickness of fourth Gr film 1897 and the thickness of fourth ESL 1842 is in a range between about 0.1 and about 2.

In some embodiments, the numbers of layers of carbon atoms of third Gr film 1895 and fourth Gr film 1897 can be determined based on structure stability of the interfaces between the third Gr film 1895 and the first metal layer plug 1838, and between the fourth Gr film 1897 and the second metal layer plug 1848. When the materials of the first metal layer plug 1838 and the second metal layer plug 1848 are Cu or Co, the layers of carbon atoms of the third Gr film 1895 and fourth Gr film 1897 can be in a range from about 1 to about 4. Since the thicknesses of third Gr film 1895 and fourth Gr film 1897 are much less than the thickness of ordinary Ta/TaN liner and/or barrier used in other devices, thus allows more volume for first metal layer plug 1838 and the fourth Gr film 1897. If the thicknesses of third Gr film 1895 and fourth Gr film 1897 are below 0.1 nm, third Gr film 1895 and fourth Gr film 1897 may not adequately reduce contact resistance between first metal layer plug 1838 and the underlying structure. On the other hand, if the thicknesses of third Gr film 1895 and fourth Gr film 1897 are greater than about 2 nm, the volume areas for first metal layer plug 1838 and the fourth Gr film 1897 decrease and consequently increase the contact resistivity. Further, when third Gr film 1895 and fourth Gr film 1897 each contains more than about 4 layers of carbon atoms, the manufacturing complicity and cost also increase.

Method 1700 (corresponding to FIGS. 17 and 18) uses FET interconnect structure 1800 with two metal layers as an example. Method 1700 can be extended to insert Gr films to a higher number of metal layer contacts/interconnects.

The present disclosure describes exemplary epitaxial low resistance contacts and damascene interconnects that include a Gr film in fin structures of FETs. This disclosure also provides fabricating methods for inserting Gr films for S/D contacts, S/D contacts, and metal vias in MEOL and/or in BEOL to achieve ultra-low contact resistivity, thinner liner and barrier, and decreased elastic scattering.

One aspect of the present disclosure provides a semiconductor device including a substrate and a fin structure on the substrate. The fin structure includes an epitaxial region. The semiconductor device can further include an etch stop layer on the epitaxial region, and an interlayer dielectric layer on the etch stop layer. The semiconductor device can further include a metal contact, above the epitaxial region, formed through the etch stop layer and the interlayer dielectric layer, and a graphene film at interfaces between the metal contact and each of the epitaxial region, the etch stop layer, and the interlayer dielectric layer.

In some embodiments, the fin structure is a merged fin structure, and the epitaxial region is a merged epitaxial region. In some embodiments, the semiconductor device can further include an other fin structure, on the substrate, including an other epitaxial region; a barrier layer on a top surface of the other epitaxial region; an other metal contact above the barrier layer; and a liner layer at an interface between the other metal contact and the barrier layer. In some embodiments, the epitaxial region is an n-type epitaxial region, and the other epitaxial region is a p-type epitaxial region. In some embodiments, the epitaxial region is a p-type epitaxial region, and the other epitaxial region is an n-type epitaxial region. In some embodiments, the semiconductor device can further include an other fin structure, on the substrate, including an other epitaxial region having an opposite type from that of the epitaxial region; and an other graphene film at an interface between the other metal contact and the other interlayer dielectric layer. In some embodiments, a thickness of the graphene film is between 0.5 nm and 5 nm. In some embodiments, the semiconductor device can further include a via on a top surface of the metal contact, and an other graphene film on a sidewall of the via. In some embodiments, the semiconductor device can further include a metal plug on a top surface of the via; and a third graphene film on a sidewall of the metal plug. In some embodiments, the semiconductor device can further include an other metal plug on a top surface of the metal plug, and an other graphene film on a sidewall of the other metal plug.

In some embodiments, a method of forming a semiconductor device, including: forming a fin structure with an epitaxial layer; forming a catalyst layer in an opening that exposes a top surface of the epitaxial layer; forming a graphene film at an interface between the catalyst layer and the epitaxial layer; and forming a metal plug on the graphene film to fill the opening. In some embodiments, the method further includes prior to forming the metal plug, removing the catalyst layer. In some embodiments, forming the catalyst layer includes depositing a first metal, and forming the metal plug includes depositing a second metal different from the first metal. In some embodiments, forming the catalyst layer includes depositing a first metal, and forming the metal plug includes depositing the first metal on the catalyst layer, where the catalyst layer is used as a seeding layer. In some embodiments, forming the catalyst layer includes depositing a first metal, and forming the metal plug includes depositing a second metal on the catalyst layer, where the catalyst layer is used as a seeding layer and the second metal is different from the first metal.

In some embodiments, a method of forming a semiconductor device, including: forming a fin structure with an epitaxial layer; forming a graphene seeding layer in an opening that exposes a top surface of the epitaxial layer; forming a graphene film by heating the graphene seeding layer to drive precipitation and growth of carbon atoms in the graphene seeding layer; and forming a metal plug on the graphene film to fill the opening. In some embodiments, forming the graphene seeding layer includes using 1,2,3,4-tetraphenylnaphthalene, Pyrene, or Benzene as a carbon source. In some embodiments, forming the graphene film includes heating the graphene seeding layer by one of an ultraviolet curing process, a laser treatment process, and a thermal anneal process. In some embodiments, forming the metal plug includes depositing a metal in the opening; and performing an activation annealing process at a temperature between about 380° C. and about 450° C. in argon or a vacuum. In some embodiments, the method further includes: prior to forming the graphene seeding layer, forming an epitaxial termination interface by treating the top surface of the epitaxial layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:

1. A method of forming a semiconductor device, comprising:
    forming a fin structure with an epitaxial layer;
    forming a catalyst layer in an opening that exposes a top surface of the epitaxial layer;
    forming a graphene film at an interface between the catalyst layer and the epitaxial layer; and
    forming a metal plug on the graphene film to fill the opening.

2. The method of claim 1, further comprising:
    prior to forming the metal plug, removing the catalyst layer.

3. The method of claim 1, wherein:
    forming the catalyst layer comprises depositing a first metal; and
    forming the metal plug comprises depositing a second metal different from the first metal.

4. The method of claim 1, wherein:
    forming the catalyst layer comprises depositing a first metal; and
    forming the metal plug comprises depositing the first metal on the catalyst layer, wherein the catalyst layer is used as a seeding layer.

5. The method of claim 1, wherein:
    forming the catalyst layer comprises depositing a first metal; and
    forming the metal plug comprises depositing a second metal on the catalyst layer, wherein the catalyst layer is used as a seeding layer and the second metal is different from the first metal.

6. A method of forming a semiconductor device, comprising:
    forming a fin structure with an epitaxial layer;
    forming a graphene seeding layer in an opening that exposes a top surface of the epitaxial layer;
    forming a graphene film by heating the graphene seeding layer to drive precipitation and growth of carbon atoms in the graphene seeding layer; and
    forming a metal plug on the graphene film to fill the opening.

7. The method of claim 6, wherein forming the graphene seeding layer comprises using 1,2,3,4-tetraphenylnaphthalene, Pyrene, or Benzene as a carbon source.

8. The method of claim 6, wherein forming the graphene film comprises heating the graphene seeding layer by one of an ultraviolet curing process, a laser treatment process, and a thermal anneal process.

9. The method of claim 6, wherein forming the metal plug comprises:
    depositing a metal in the opening; and
    performing an activation annealing process at a temperature between about 380° C. and about 450° C. in argon or a vacuum.

10. The method of claim 6, further comprising:
    prior to forming the graphene seeding layer, forming an epitaxial termination interface by treating the top surface of the epitaxial layer.

11. The method of claim 1, wherein forming the graphene film comprises flowing acetylene over the catalyst layer to form a layer of carbon atoms on the catalyst layer.

12. The method of claim 11, further comprising annealing the layer of carbon atoms at a temperature between about 400° ° C. and about 450° ° C.

13. The method of claim 1, further comprising removing the catalyst layer outside the opening using a chemical mechanical polishing process.

14. The method of claim 1, further comprising forming the graphene film with a thickness between about 0.3 nm and about 5 nm.

15. The method of claim 6, further comprising removing the graphene film and the graphene seeding layer outside the opening using a chemical mechanical polishing process.

16. The method of claim 6, further comprising forming the graphene layer at an interface between the metal plug and epitaxial layer.

17. A method, comprising:
    forming, on a substrate, a fin structure comprising an epitaxial region;
    forming an etch stop layer on the epitaxial region;
    forming an interlayer dielectric layer on the etch stop layer;

forming an opening in the interlayer dielectric and the etch stop layer;
forming a retentive catalyst layer within the opening; and
forming a graphene layer at an interface of the retentive catalyst layer and the epitaxial region.

18. The method of claim 17, further comprising forming a metal contact on the retentive catalyst layer.

19. The method of claim 18, further comprising forming the retentive catalyst layer and the metal contact with the same material.

20. The method of claim 17, wherein forming the retentive catalyst layer comprises forming the retentive catalyst layer on a bottom surface and sidewalls of the opening.

* * * * *